United States Patent
Pei

(10) Patent No.: US 9,581,906 B2
(45) Date of Patent: Feb. 28, 2017

(54) DEVICE SUBSTRATE AND FABRICATING METHOD THEREOF

(71) Applicant: Au Optronics Corporation, Hsinchu (TW)

(72) Inventor: Kai Pei, Taipei (TW)

(73) Assignee: Au Optronics Corporation, Hsinchu (TW)

(*) Notice: Subject to any disclaimer, the term of this patent is extended or adjusted under 35 U.S.C. 154(b) by 18 days.

(21) Appl. No.: 14/316,812

(22) Filed: Jun. 27, 2014

(65) Prior Publication Data
US 2015/0293279 A1 Oct. 15, 2015

(30) Foreign Application Priority Data
Apr. 10, 2014 (TW) .............................. 103113206 A

(51) Int. Cl.
| | | |
|---|---|---|
| H01L 21/8238 | (2006.01) | |
| G03F 7/20 | (2006.01) | |
| G02B 5/20 | (2006.01) | |
| G02B 5/00 | (2006.01) | |
| G02F 1/1335 | (2006.01) | |
| G02F 1/1339 | (2006.01) | |

(52) U.S. Cl.
CPC .............. *G03F 7/20* (2013.01); *G02B 5/003* (2013.01); *G02B 5/201* (2013.01); *G02F 1/13394* (2013.01); *G02F 1/133516* (2013.01); *G02F 2001/13396* (2013.01)

(58) Field of Classification Search
CPC ........... G02B 5/20; G02B 5/201; G02B 5/003
See application file for complete search history.

(56) References Cited

U.S. PATENT DOCUMENTS

| | | | | |
|---|---|---|---|---|
| 7,817,239 B2* | 10/2010 | Tseng | .................. | G02F 1/13394 349/157 |
| 7,948,599 B1* | 5/2011 | Ryu | .................. | G02F 1/133512 349/106 |
| 2005/0095514 A1* | 5/2005 | Lee | ......................... | G02B 5/201 430/7 |
| 2007/0165179 A1* | 7/2007 | Jang | .................... | G02F 1/13394 349/156 |
| 2011/0104974 A1 | 5/2011 | Ryu | | |

FOREIGN PATENT DOCUMENTS

| | | |
|---|---|---|
| CN | 1808191 | 7/2006 |
| TW | 201319680 | 5/2013 |
| TW | 201327510 | 7/2013 |

\* cited by examiner

*Primary Examiner* — A. Sefer
(74) *Attorney, Agent, or Firm* — Jianq Chyun IP Office

(57) ABSTRACT

A device substrate and a fabricating method thereof are provided. The device substrate includes a substrate and a patterned light-shielding layer. The patterned light-shielding layer having a plurality of pixel openings and a plurality of first exposure openings is disposed on the substrate, and an area and/or shape of one of the first exposure openings is different from an area and/or shape of one of the pixel openings.

10 Claims, 25 Drawing Sheets

DEVICE SUBSTRATE AND FABRICATING METHOD THEREOF

CROSS-REFERENCE TO RELATED APPLICATION

This application claims the priority benefit of Taiwan application serial no. 103113206, filed on Apr. 10, 2014. The entirety of the above-mentioned patent application is hereby incorporated by reference herein and made a part of this specification.

BACKGROUND OF THE INVENTION

[Field of the Invention]

The invention relates to a device substrate and a fabricating method thereof, and more particularly relates to a device substrate having exposure openings and a fabricating method thereof.

[Description of Related Art]

As information technology, wireless mobile communication, and information appliances rapidly develop in the recent years, the input devices for a great many information products have been changed from the conventional keyboards or mice to touch display panels for the purposes of convenience, miniaturization, and being user-friendly. Especially, the touch display panel has become the most popular product among all.

The conventional touch display panel is mainly composed of an active device array substrate, an opposite substrate (e.g. color filter substrate), and a display medium disposed between these substrates. Moreover, multiple main spacers and multiple secondary spacers are located between the active device array substrate and the opposite substrate and may be disposed on the opposite substrate or the active device array substrate, for example. In the fabricating method of the device substrate (e.g. opposite substrate, color filter substrate, or active device array substrate, etc.) for the conventional touch display panel, a phase shift mask, half tone mask, or gray tone mask is required for fabricating the main spacers and the secondary spacers that have different heights. The spacers are generally formed of a transparent material and have high UV transmittance. Therefore, the exposure amount needs to be very low in order to achieve a high level difference (i.e. large height difference). However, the control capability of the level difference is limited to the stability of the phase shift mask, half tone mask, or gray tone mask at low penetration. Besides, because the transmittance of the phase shift mask, half tone mask, or gray tone mask is a fixed value after the mask is completed at the factory, the adjustable range of the exposure amount is also limited. In addition, the phase shift mask, half tone mask, or gray tone mask further faces problems such as high production costs and longer stock preparation time, etc. Hence, how to use a general mask (that is, without using the phase shift mask, half tone mask, or gray tone mask) to fabricate main spacers and secondary spacers with different heights while maintaining favorable level difference (i.e. height difference) control capability is an issue that needs to be overcome in the production technology of display panels.

SUMMARY OF THE INVENTION

The invention provides a device substrate and a fabricating method thereof, which fabricate main spacers and secondary spacers having different heights with use of a general mask and have favorable level difference control capability.

The invention provides a device substrate including a substrate and a patterned light-shielding layer. The patterned light-shielding layer is disposed on the substrate and includes a plurality of pixel openings and a plurality of first exposure openings. One of the pixel openings and one of the first exposure openings have different areas and/or shapes.

The invention further provides a device substrate including a plurality of sub-pixel regions, and the device substrate includes a substrate and a plurality of spacers. The spacers are disposed on the substrate, and a material of the spacers includes a photosensitive material. Each of the spacers has a top portion, a connection portion, and a bottom portion, wherein the connection portion is located between the top portion and the bottom portion. A cross-linking density of the photosensitive material of the connection portion is smaller than or equal to a cross-linking density of the photosensitive material of at least one of the top portion and the bottom portion, or a decomposition strength of the photosensitive material of the connection portion is larger than or equal to a decomposition strengths of the photosensitive material of at least one of the top portion and the bottom portion.

The invention further provides a fabricating method of a device substrate, and the fabricating method includes the following steps. A substrate is provided. A patterned light-shielding layer, including a plurality of pixel openings and a plurality of first exposure openings, is disposed on the substrate, and one of the first exposure openings and one of the pixel openings have different areas and/or shapes. A photoresist material layer is formed on the patterned light-shielding layer. An exposure process and a development process are performed on the photoresist material layer to form a plurality of first spacers on the substrate, wherein vertical projections of the first spacers respectively overlap the first exposure openings.

Based on the above, in addition to using a general mask as a shielding mask for performing front exposure on the photoresist material layer, the patterned light-shielding layer can serve as the shielding mask for performing back exposure on the photoresist material layer, wherein the photoresist material layer may be a negative or positive photoresist. Accordingly, by combining the steps of front exposure, back exposure, non-exposure, and development with different exposure doses (saturated/unsaturated exposure) or different wavelengths, main spacers and secondary spacers having different heights can be fabricated and favorable level difference (i.e. height difference) control capability can be achieved. Thus, the device substrate and the fabricating method of the invention have advantages of lower production costs and simpler fabricating processes.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
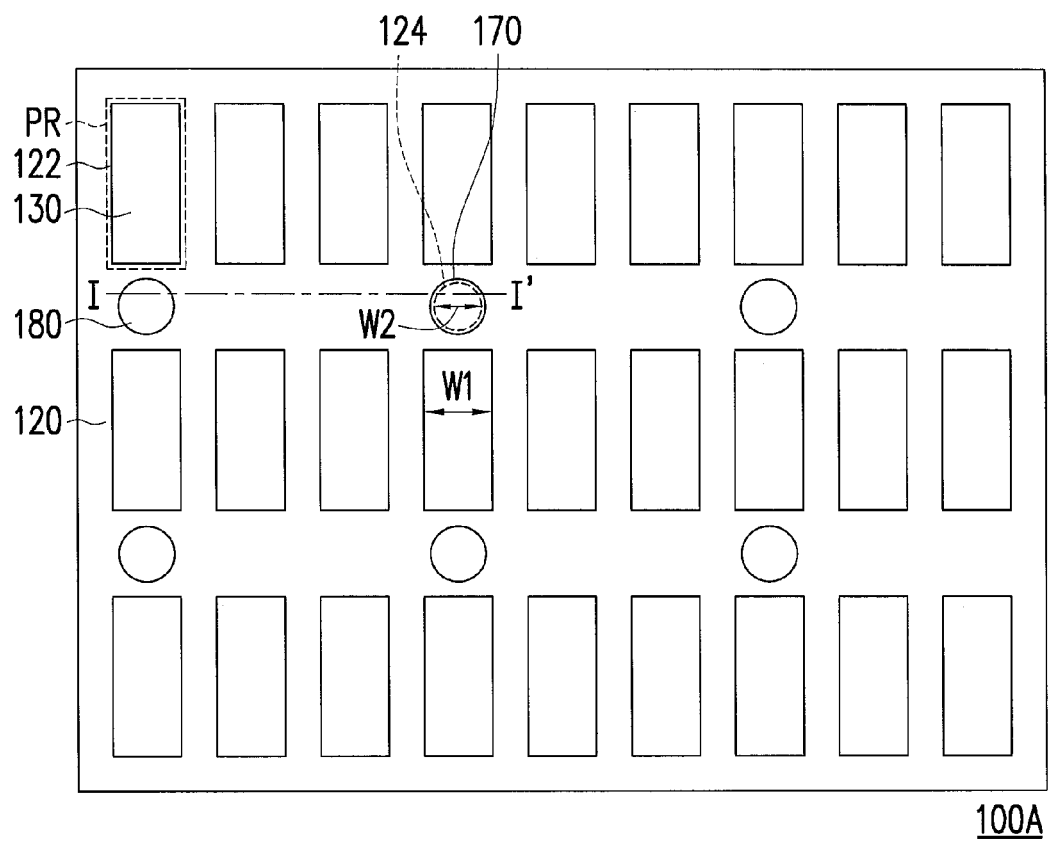
FIG. 1A is a schematic top view of a device substrate according to the first embodiment of the invention.
Figure 1B:
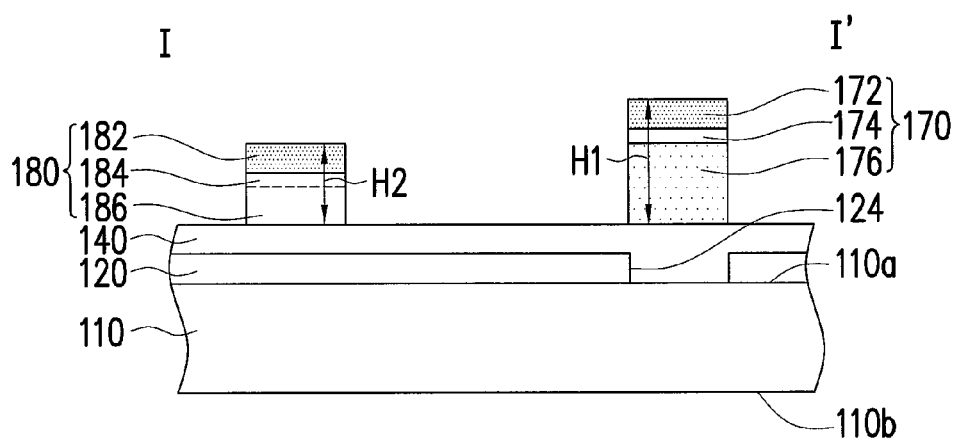
FIG. 1B is a schematic cross-sectional view of the device substrate of FIG. 1A along the line I-I'.

FIG. 1A is a schematic top view of a device substrate according to the first embodiment of the invention. FIG. 1B is a schematic cross-sectional view of the device substrate of FIG. 1A along the line I-I'. In this embodiment, a device substrate 100A is a color filter substrate, an opposite substrate, an active device array substrate, or other suitable device substrates, for example. In the following paragraphs, the device substrate 100A is for example a color filter substrate of a touch display panel in the embodiment of the invention. However, it is noted that the invention is not limited thereto. A display panel of the touch display panel is a liquid crystal display panel, an organic light emitting diode display panel, an electrophoretic display panel, or a plasma display panel, for example.

With reference to FIG. 1A and FIG. 1B, the device substrate 100A includes a plurality of sub-pixel regions that are arranged in a matrix. Moreover, the device substrate 100A includes a substrate 110, a patterned light-shielding layer 120, a plurality of color filter patterns 130, a transparent layer 140, a plurality of first spacers 170, and a plurality of second spacers 180.

The substrate 110 has a first side 110a and a second side 110b that are disposed opposite to each other, wherein the first side 110a is a side facing an active device array substrate (not shown), for example. A material of the substrate 110 is an inorganic or organic transparent material, such as glass or plastic, for example.

The patterned light-shielding layer 120 is disposed on the first side 110a of the substrate 110. The patterned light-shielding layer 120 has a plurality of pixel openings 122 and a plurality of first exposure openings 124. The pixel openings 122 are located in the sub-pixel regions PR of the device substrate 100A, and the pixel openings 122 are arranged in a matrix, for example. Each of the first exposure openings 124 is located between two adjacent pixel openings 122. In this embodiment, a shape of the pixel opening 122 is rectangular and a width W1 thereof is in a range of 12 micrometers to 120 micrometers, for example. A shape of the first exposure opening 124 is circular and a width W2 thereof (i.e. diameter) is in a range of 4 micrometers to 40 micrometers, for example. However, it is noted that the invention is not limited thereto. The scope of the invention covers various embodiments as long as one of the first exposure openings 124 and one of the pixel openings 122 have different areas and/or shapes. The shape of the first exposure opening 124 or the pixel opening 122 in FIG. 1A may be circular, elliptic, rectangular, square, triangular, rhombic, polygonal, or other suitable shapes. The patterned light-shielding layer 120 is a black matrix, for example, and a material thereof is a black resin, metal or other suitable materials. Furthermore, according to other embodiments, for example, in a multi-domain vertical alignment (MVA) liquid crystal display panel, the patterned light-shielding layer 120 may further include an alignment protrusion, such that liquid crystal molecules in a liquid crystal layer tilt in different directions to form a plurality of alignment regions so as to achieve a wide viewing angle display effect.

The color filter patterns 130 are respectively located in the pixel openings 122, not in the first exposure openings 124. The color filter patterns 130 are color filter layers. In this embodiment, the color filter patterns 130 are formed of a plurality of red filter patterns, a plurality of green filter patterns, and a plurality of blue filter patterns, for example. However, it is noted that the invention is not limited thereto. In other embodiments, the color filter patterns 130 may include red filter patterns, green filter patterns, blue filter patterns, white filter patterns, yellow filter patterns, filter patterns of other suitable colors, or any combination of the foregoing filter patterns. Moreover, an arrangement of the color filter patterns 130 on the substrate 110 includes a stripe form, a triangle form, a mosaic form, a four-pixel form, or other suitable forms, for example. In other words, the invention is not intended to limit the color combination, number, and arrangement of the color filter patterns 130. In addition, according to other embodiments, for example, in a color filter on array (COA) display panel, the device substrate 100A is an opposite substrate and does not include the color filter patterns 130, for example.

The transparent layer 140 is disposed on the patterned light-shielding layer 120 and the color filter patterns 130. In other words, the transparent layer 140 covers the substrate 110, the patterned light-shielding layer 120, the color filter patterns 130 and the first exposure openings 124. The transparent layer 140 may be a transparent electrode layer, a transparent flat/insulating layer, or a combination of the foregoing. The transparent electrode layer is formed of a single-layer or multi-layer transparent material, which may be indium tin oxide (ITO), indium zinc oxide (IZO), aluminum zinc oxide (AZO), aluminum tin oxide (ATO), $SnO_2$:F (FTO), or other suitable materials, for example. The transparent flat/insulating layer is formed of a single-layer or multi-layer transparent material, such as polymethyl methacrylate (PMMA), polyimide (PI), siloxane, silicon nitride and silicon oxide, or other suitable material.

The first spacers 170 are disposed on the substrate 110, and vertical projections of the first spacers 170 respectively overlap the first exposure openings 124. More specifically, the first spacers 170 are disposed on the transparent layer 140 corresponding to the first exposure openings 124, so as to cover the first exposure openings 124. In this embodiment, when the device substrate 100A is a color filter substrate of a touch display panel, the first spacers 170 are main spacers, for example, for maintaining a gap between the color filter substrate and the active device array substrate. A height H1 of each of the first spacers 170 is in a range of 1 micrometer to 6 micrometers, and preferably in a range of 2.5 micrometers to 4 micrometers, for example. In this embodiment, the height H1 (i.e. maximum height) of the first spacer 170 is a maximum distance between a top surface (not shown) of the first spacer 170 and a top surface (not shown) of the transparent layer 140, for example. A material of the first spacer 170 is a photosensitive material, for example. A main structure of the photosensitive material includes PMMA, PI, siloxane, or other suitable main structures, and includes acryl, epoxy, novolak, or other suitable functional groups and various photo initiators having different absorption wavelengths.

It is noted that the first spacers 170 may completely or partially cover the first exposure openings 124. In other words, a size of each of the first spacers 170 may be larger than, equal to, or smaller than a size of each of the first exposure openings 124. For example, if the first exposure openings 124 do not overlap or partially overlap light-shielding elements (e.g. active device, scan line, or data line, etc.) on the active device array substrate, the first spacers 170 may be a black photosensitive material, and the size of each of the first spacers 170 may be larger than or equal to the size of each of the first exposure openings 124, so as to avoid light leakage from the first exposure openings 124. Further, for example, if the first exposure openings 124 and the light-shielding elements (e.g. active device, scan line, or data line, etc.) formed on the active device array substrate completely overlap, the first spacers 170 may be a transparent photosensitive material or photosensitive materials of other suitable colors, and the size of each of the first spacers 170 may be larger than, equal to, or smaller than the size of each of the first exposure openings 124 because the first exposure openings 124 are completely shielded to avoid light leakage. The number of the first spacers 170 on the substrate 110 is determined according to the actual situation (e.g. sizes or other design specifications of the substrate and the pixel). The shape of the first spacer 170 in FIG. 1A may be circular, elliptic, rectangular, square, triangular, rhombic, polygonal, or other suitable shapes, for example. A cross-sectional shape of the first spacer 170 in FIG. 1B is rectangular, for example. However, it is noted that the invention is not limited thereto. In other embodiments, the cross-sectional shape of the first spacer 170 may also be square, trapezoid, or other suitable shapes. In other words, the invention is not intended to limit the color, size, number, shape, and cross-sectional shape of the first spacers 170.

It is also noted that each of the first spacers 170 has a top portion 172, a connection portion 174, and a bottom portion 176. The bottom portion 176 is a portion close to the first exposure opening 124, the top portion 172 is a portion away from the first exposure opening 124, and the connection portion 174 is located between the top portion 172 and the bottom portion 176 and contacts both of them. In this embodiment, a relationship between cross-linking densities (or cross-linking strengths) of the photosensitive material of the first spacer 170 is: the bottom portion 176>the top portion 172>the connection portion 174. Furthermore, because the first spacer 170 is a negative photoresist, a cross-linking functional group of the photosensitive material of the first spacer 170 includes acryl and epoxy, wherein the portion having higher cross-linking density (e.g. the bottom portion 176) has more acryl cross-linking than the portion having lower cross-linking density (e.g. the top portion 172 or the connection portion 174). In other words, the portion having higher cross-linking density has much more carbon content than oxygen content.

The second spacers 180 are disposed on the substrate 110, and vertical projections of the second spacers 180 are respectively outside the first exposure openings 124. More specifically, the second spacers 180 are disposed on the transparent layer 140 and do not overlap the first exposure openings 124. In this embodiment, when the device substrate 100A is a color filter substrate of a touch display panel, the second spacers 180 are secondary spacers, for example. Moreover, in this embodiment, the material of the first spacers 170 and the second spacers 180 is a negative photoresist, and the height H1 of each of the first spacers 170 is larger than a height H2 of each of the second spacers 180. A height difference (H1-H2) between the first spacer 170 and the second spacer 180 is larger than 0.2 micrometer, for example. The material of the second spacer 180 is a photosensitive material, for example.

It is noted that the number of the second spacers 180 on the substrate 110 is determined according to the actual situation (e.g. the sizes or other design specifications of the substrate and the pixel). A shape of the second spacer 180 in FIG. 1A may be circular, elliptic, rectangular, square, triangular, rhombic, polygonal, or other suitable shapes, for example. A cross-sectional shape of the second spacer 180 in FIG. 1B is rectangular, for example. However, it is noted that the invention is not limited thereto. In other embodiments, the cross-sectional shape of the second spacer 180 may also be square, trapezoid, or other suitable shapes. In other words, the invention is not intended to limit the color, size, number, shape, and cross-sectional shape of the second spacers 180.

It is also noted that each of the second spacers 180 has a top portion 182, a connection portion 184, and a bottom portion 186. The bottom portion 186 is a portion close to the patterned light-shielding layer 120, the top portion 182 is a portion away from the patterned light-shielding layer 120, and the connection portion 184 is located between the top portion 182 and the bottom portion 186 and contacts both of them. In this embodiment, a relationship between cross-linking densities of the photosensitive material of the second spacer 180 is: the top portion 182>the connection portion 184=the bottom portion 186. As described above, in this embodiment, if there is a difference between exposure intensities received by the top portion, the connection portion, and the bottom portion of the spacer, interfaces therebetween are indicated by solid lines. If there is no obvious difference between the exposure intensities received by the top portion, the connection portion, and the bottom portion of the spacer, broken lines are used to indicate that no interface exists or it is difficult to distinguish the layers. Furthermore, a ratio of the heights of the top portion, the connection portion, and the bottom portion of the spacer illustrated in this embodiment is merely an example and should not be construed as a limitation to the actual height ratio.

In addition, an alignment layer (not shown) may be further disposed on the transparent layer 140, the first spacers 170, and the second spacers 180. That is to say, the alignment layer covers a side of the device substrate 100A close to a display medium, such that the display medium is in a specific arrangement direction.

FIG. 2A to FIG. 2D are schematic cross-sectional views showing a fabricating method of the device substrate 100A of FIG. 1B.

Figure 2A:
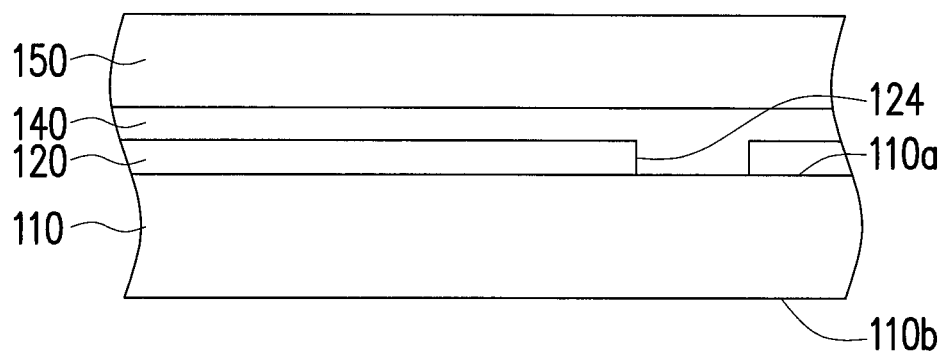
FIG. 2A to FIG. 2D are schematic cross-sectional views showing a fabricating method of the device substrate of FIG. 1B.

With reference to FIG. 2A, the substrate 110 is provided, and the substrate 110 has the first side 110a and the second side 110b that are disposed opposite to each other. Next, the patterned light-shielding layer 120 is formed on the first side 110a of the substrate 110. The patterned light-shielding layer 120 has a plurality of pixel openings 122 (as shown in FIG. 1A) and a plurality of first exposure openings 124, and one of the first exposure openings 124 and one of the pixel openings 122 have different areas and/or shapes. A forming method of the patterned light-shielding layer 120 for example includes forming a light-shielding layer (not shown) on the substrate 110 and then performing a lithography process to pattern the light-shielding layer. The color filter patterns 130 (as shown in FIG. 1A) are respectively formed in pixel openings 122. A forming method of the color filter patterns 130 for example includes coating a resin material layer (not shown) on the substrate 110 by a spin coating, slit coating, or spin-less coating, and then patterning the resin material layer. Steps of patterning the resin material layer include soft baking, exposing, developing, and hard baking the resin material layer. Thereafter, the transparent layer 140 is formed to cover the substrate 110, the patterned light-shielding layer 120, the color filter patterns 130 and the first exposure openings 124. A portion of the transparent layer 140 is completely filled within the first exposure openings 124. A forming method of the transparent layer 140 is a physical vapor deposition method or a chemical vapor deposition method, for example. Afterward, a photoresist material layer 150 is formed on the transparent layer 140. A forming method of the photoresist material layer 150 is spin coating, for example. In this embodiment, a material of the photoresist material layer 150 includes a photosensitive material, and the photoresist material layer 150 is a negative photoresist. For example, the photoresist material layer 150 may be a negative photoresist of a black photosensitive material, and an OD value thereof is larger than 1. The cross-linking strength between material molecules increases after exposure, and in comparison with an unexposed or low-dose exposed portion, a relatively larger layer thickness is formed after hard baking. Therefore, different exposure doses may be used to fabricate spacers with different heights. To be more specific, after exposure, the material of the negative photoresist is cross-linked to generate a 2D or 3D structure, which increases the layer thickness and does not easily collapse after being hard baked to form a layer. Accordingly, in this embodiment, the higher the cross-linking density (or cross-linking strength) of the material of the negative photoresist is, the larger the layer thickness becomes after hard baking. However, due to the influence of the material properties and fabricating processes, in other embodiments, an absolute height of the layer thickness of the exposed negative photoresist after hard baking may not necessarily be higher than an absolute height before hard baking. Nevertheless, the exposed negative photoresist has relatively larger layer thickness than an unexposed or low-dose exposed negative photoresist.

Figure 2B:
Figure 2B:
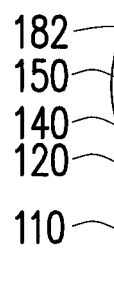
Figure 2C:
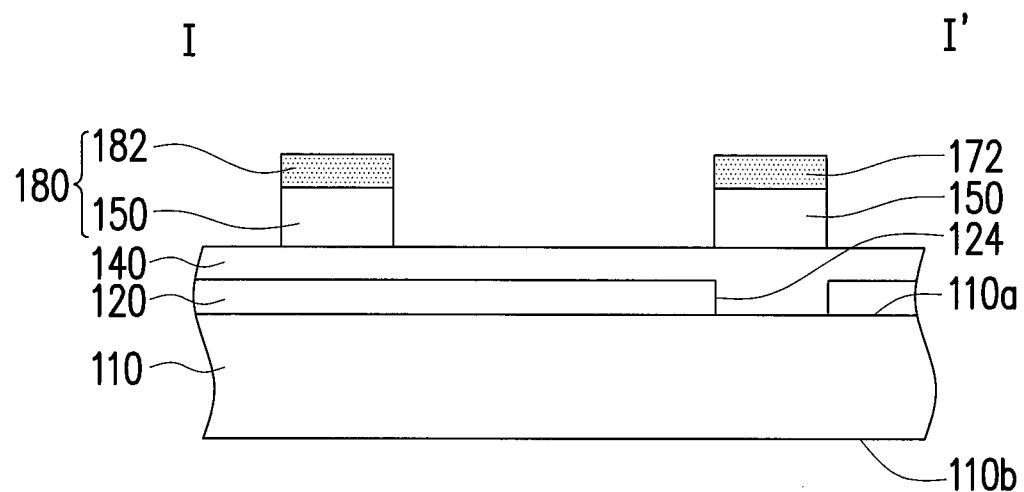
Figure 2D:
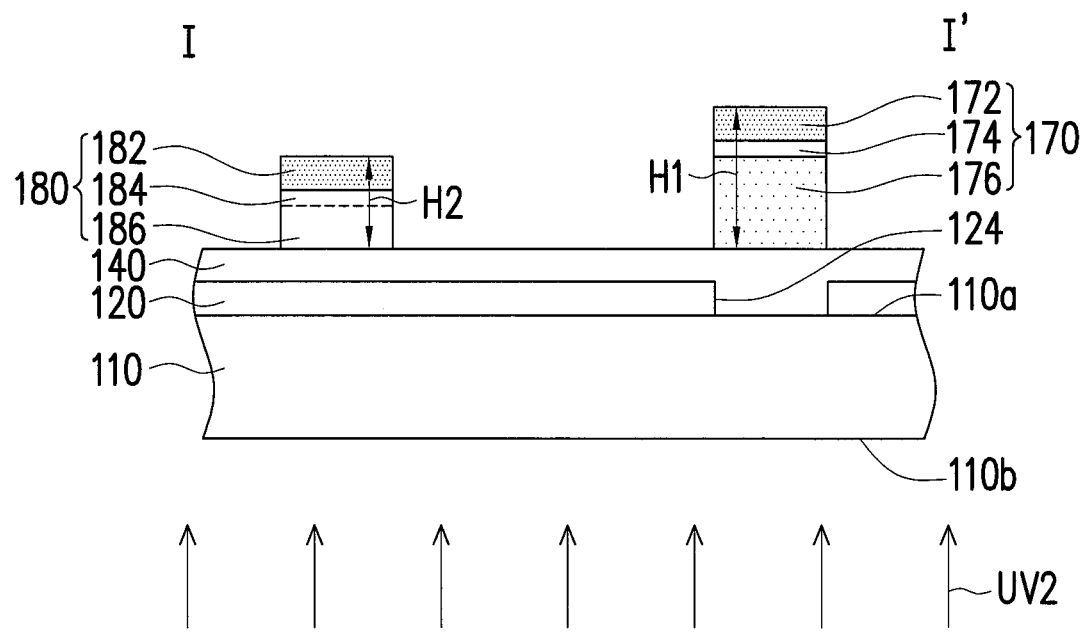

Next, as shown in FIG. 2B to FIG. 2D, an exposure process and a development process are performed on the photoresist material layer 150 to form a plurality of first spacers 170 and a plurality of second spacers 180 on the substrate 110. In the following paragraphs, Steps (a), (b), and (c) included in the exposure process and the development process performed on the photoresist material layer 150 are explained in detail.

With reference to FIG. 2B, Step (a) is to provide a mask 160 on the photoresist material layer 150, so as to perform an exposure UV1 on the photoresist material layer 150 with the mask 160 as a shielding mask. Step (a) may also be called a front exposure, which is to perform the exposure UV1 on the first side 110a of the substrate 110. In this embodiment, Step (a) is an unsaturated exposure (the exposure dose is in a range of 6 mJ to 30 mJ, for example), and because the photoresist material layer 150 is a negative photoresist, the cross-linking density of the photosensitive material of a portion of the photoresist material layer 150 that receives the exposure UV1 is increased to form the top portion 172 and the top portion 182 that are development-resistant (i.e. will not be removed in the development step). A vertical projection of the top portion 172 respectively overlaps the first exposure opening 124, and a vertical projection of the top portion 182 is located outside the first exposure opening 124 respectively.

With reference to FIG. 2C, Step (b) is to develop the photoresist material layer 150 after the exposure UV1. Step (b) may also be called a development. In this embodiment, because the top portion 172 and top portion 182 which have higher development-resistant than other portions cover a portion of the photoresist material layer 150, the portion of the photoresist material layer 150 covered by the top portion 172 and the top portion 182 is not removed in Step (b) while the uncovered portion of the photoresist material layer 150 is removed. A plurality of the second spacers 180 are formed by Step (a) and Step (b), and the vertical projections of the second spacers 180 are respectively outside the first exposure openings 124.

With reference to FIG. 2D, Step (c) is to perform an exposure UV2 on the photoresist material layer 150 with the patterned light-shielding layer 120 as a shielding mask. Step (c) may also be called a back exposure, which is to perform the exposure UV2 on the second side 110b of the substrate 110. In addition, the exposure UV1 and the exposure UV2 have different exposure doses or different wavelengths, for example. In this embodiment, Step (c) is a saturated exposure (the exposure dose is 300 mJ, for example), and because the photoresist material layer 150 is a negative photoresist, the cross-linking density of the photosensitive material of a portion of the photoresist material layer 150 that receives the exposure UV2 is increased to form the bottom portion 176. In Step (c), a portion of the photoresist material layer 150 that does not receive the exposure UV2 forms the connection portion 174. However, it is noted that the invention is not limited thereto. In other embodiments, the connection portion 174 and the bottom portion 176 may both receive the exposure UV2. Accordingly, a plurality of the first spacers 170 are formed by Step (a), Step (b), and Step (c), and the vertical projections of the first spacers 170 respectively overlap the first exposure openings 124. Moreover, each of the first spacers 170 includes the top portion 172, the connection portion 174, and the bottom portion 176.

In this embodiment, because the second spacers 180 only receive the unsaturated front exposure, the relationship between the cross-linking densities of the photosensitive material of the second spacers 180 is: the top portion 182>the connection portion 184=the bottom portion 186. Further, because the first spacers 170 receive the unsaturated front exposure and saturated back exposure, the relationship between the cross-linking densities of the photosensitive material of the first spacers 170 is: the bottom portion 176>the top portion 172>the connection portion 174. Accordingly, after hard baking, the height H1 of the first spacer 170 is larger than the height H2 of the second spacer 180.

In the embodiment of FIG. 2A to FIG. 2D, a sequence of the steps included in the exposure process and the development process performed on the photoresist material layer 150 is Steps (a)/(b)/(c) (i.e. Step (a) precedes Step (b), and Step (c) is after Step (a) and Step (b)), for example. However, the invention is not limited thereto. In other embodiments, the sequence of the steps included in the exposure process and the development process performed on the photoresist material layer 150 may also be Steps (c)/(b)/(a), Steps (a)/(c)/(b), or Steps (c)/(a)/(b), as long as Step (a) precedes Step (c) or Step (c) precedes Step (a). Various sequences of Steps (a), (b), and (c) may be inferred by those skilled in the art from the teaching of the embodiment of FIG. 2A to FIG. 2D. Thus, details are not illustrated here. In addition, the steps of forming the spacers may further include performing soft baking or hard baking on the photoresist material layer 150.

Figure 3A:
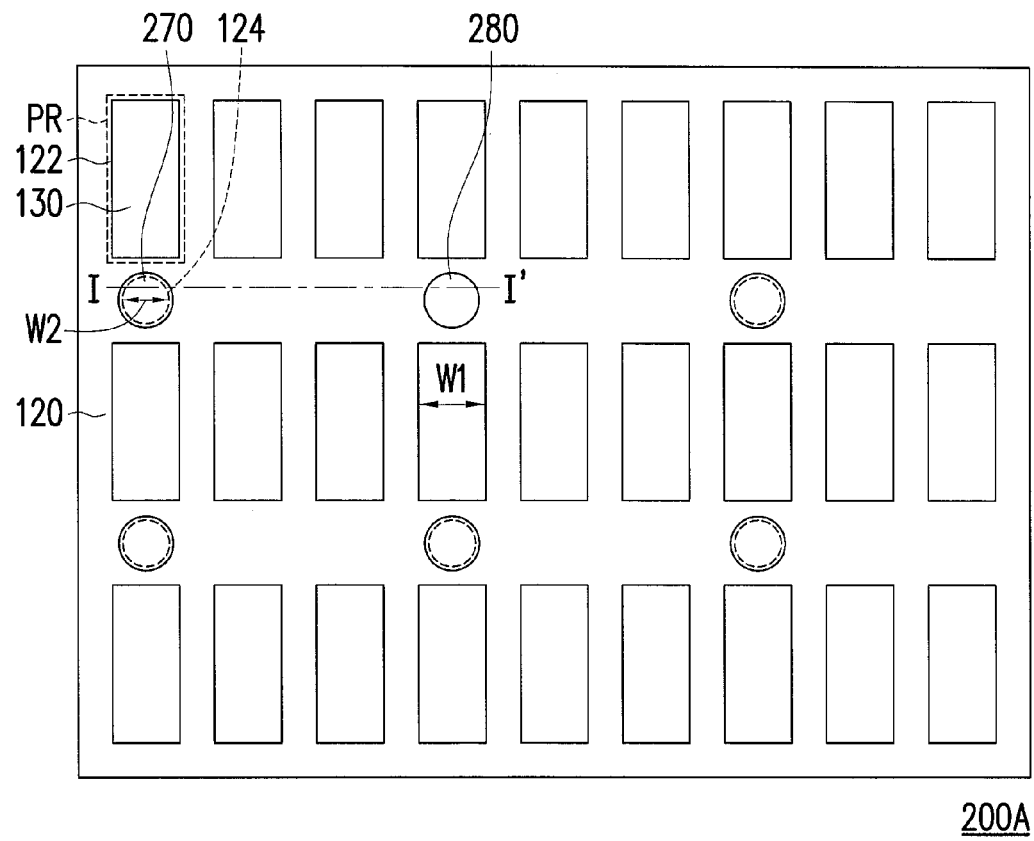
FIG. 3A is a schematic top view of a device substrate according to the second embodiment of the invention.
Figure 3B:
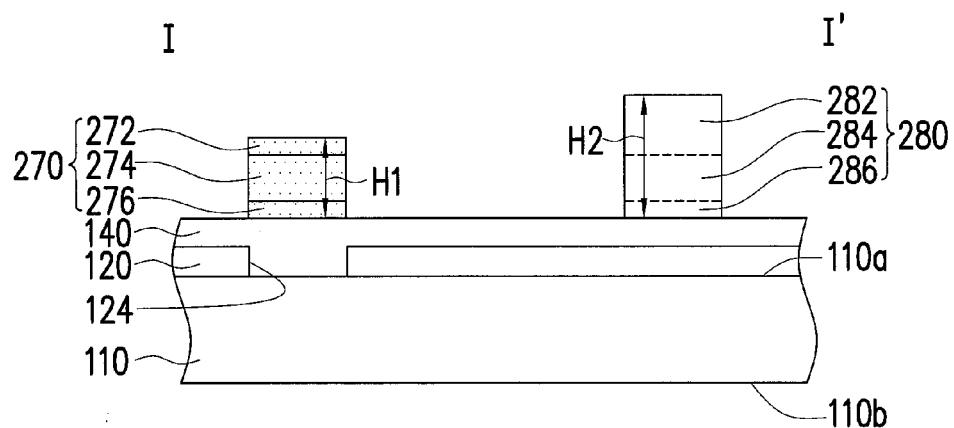
FIG. 3B is a schematic cross-sectional view of the device substrate of FIG. 3A along the line I-I'.

FIG. 3A is a schematic top view of a device substrate according to the second embodiment of the invention. FIG. 3B is a schematic cross-sectional view of the device substrate of FIG. 3A along the line I-I'. The embodiment of FIG. 3A to FIG. 3B is similar to the embodiment of FIG. 1A to FIG. 1B. Therefore, identical or similar elements are denoted by the same or similar reference numerals, which will not be described again hereinafter. With reference to FIG. 3A and FIG. 3B, a difference between the embodiment of FIG. 3A to FIG. 3B and the embodiment of FIG. 1A to FIG. 1B is that: in a device substrate 200A, a material of first spacers 270 and second spacers 280 is a positive photoresist, and the height H2 of each of the second spacers 280 is larger than the height H1 of each of the first spacers 270.

A plurality of the first spacers 270 are disposed on the substrate 110, and vertical projections of the first spacers 270 respectively overlap the first exposure openings 124. More specifically, the first spacers 270 are disposed on the transparent layer 140 corresponding to the first exposure openings 124, so as to cover the first exposure openings 124. In this embodiment, when the device substrate 200A is a color filter substrate of a touch display panel, the first spacers 270 are secondary spacers, for example. The material of the first spacer 270 is a photosensitive material, for example. Moreover, the invention is not intended to limit the color, size, number, shape, and cross-sectional shape of the first spacers 270.

It is also noted that each of the first spacers 270 has a top portion 272, a connection portion 274, and a bottom portion 276. The bottom portion 276 is a portion close to the first exposure opening 124, the top portion 272 is a portion away from the first exposure opening 124, and the connection portion 274 is located between the top portion 272 and the bottom portion 276. In this embodiment, a relationship between decomposition strengths of the photosensitive material of the first spacer 270 is: the bottom portion 276>the connection portion 274>the top portion 272 (equivalent to the relationship between the cross-linking densities, which is the bottom portion 276<the connection portion 274<the top portion 272). In other words, a weak development layer of the top portion 272 of the first spacer 270 can be removed. Because the connection portion 274 and the bottom portion 276 are protected by the top portion 272, only lateral development etching occurs.

A plurality of the second spacers 280 are disposed on the substrate 110, and vertical projections of the second spacers 280 are respectively outside the first exposure openings 124. More specifically, the second spacers 280 are disposed on the transparent layer 140 and do not overlap the first exposure openings 124. In this embodiment, when the device substrate 200A is a color filter substrate of a touch display panel, the second spacers 280 are main spacers, for example, for maintaining a gap between the color filter substrate and the active device array substrate. The height H2 of each of the second spacers 280 is in a range of 1 micrometer to 6 micrometers, and preferably in a range of 2.5 micrometers to 4 micrometers, for example. Moreover, in this embodiment, the material of the first spacers 270 and the second spacers 280 is a positive photoresist, and the height H2 of each of the second spacers 280 is larger than the height H1 of each of the first spacers 270. A height difference (H2−H1) between the first spacer 270 and the second spacer 280 is larger than 0.2 micrometer, for example. The material of the second spacer 280 is a photosensitive material, for example. Moreover, the invention is not intended to limit the color, size, number, shape, and cross-sectional shape of the second spacers 280.

It is also noted that each of the second spacers 280 has a top portion 282, a connection portion 284, and a bottom portion 286. The bottom portion 286 is a portion close to the patterned light-shielding layer 120, the top portion 282 is a portion away from the patterned light-shielding layer 120, and the connection portion 284 is located between the top portion 282 and the bottom portion 286. In this embodiment, a relationship between decomposition strengths of the photosensitive material of the second spacer 280 is: the bottom portion 286=the connection portion 284=the top portion 282 (equivalent to the relationship between the cross-linking densities, which is the bottom portion 286=the connection portion 284=the top portion 282).

FIG. 4A to FIG. 4D are schematic cross-sectional views showing a fabricating method of the device substrate 200A of FIG. 3B. The embodiment of FIG. 4A to FIG. 4D is similar to the embodiment of FIG. 2A to FIG. 2D. Therefore, identical or similar elements are denoted by the same or similar reference numerals, which will not be described again hereinafter.

Figure 4A:
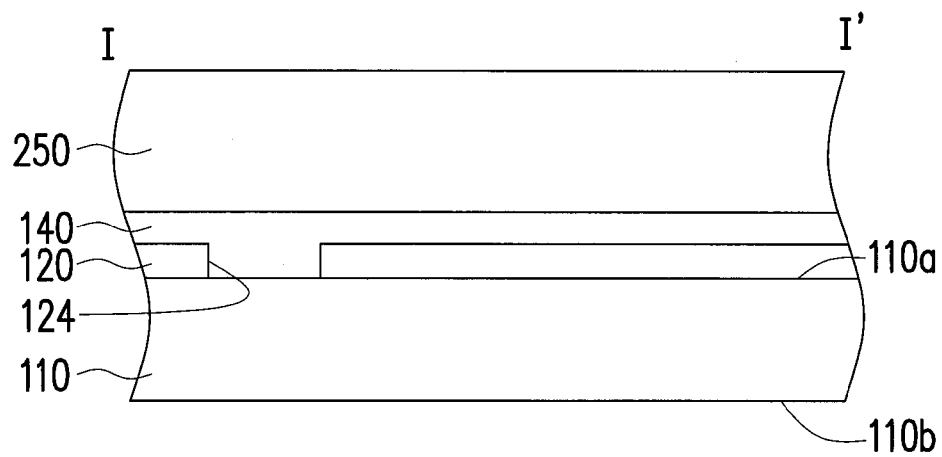
FIG. 4A to FIG. 4D are schematic cross-sectional views showing a fabricating method of the device substrate of FIG. 3B.

With reference to FIG. 4A, a photoresist material layer 250 is formed on the transparent layer 140. A forming method of the photoresist material layer 250 is spin coating, for example. In this embodiment, a material of the photoresist material layer 250 includes a photosensitive material, and the photoresist material layer 250 is a positive photoresist.

Figure 4B:
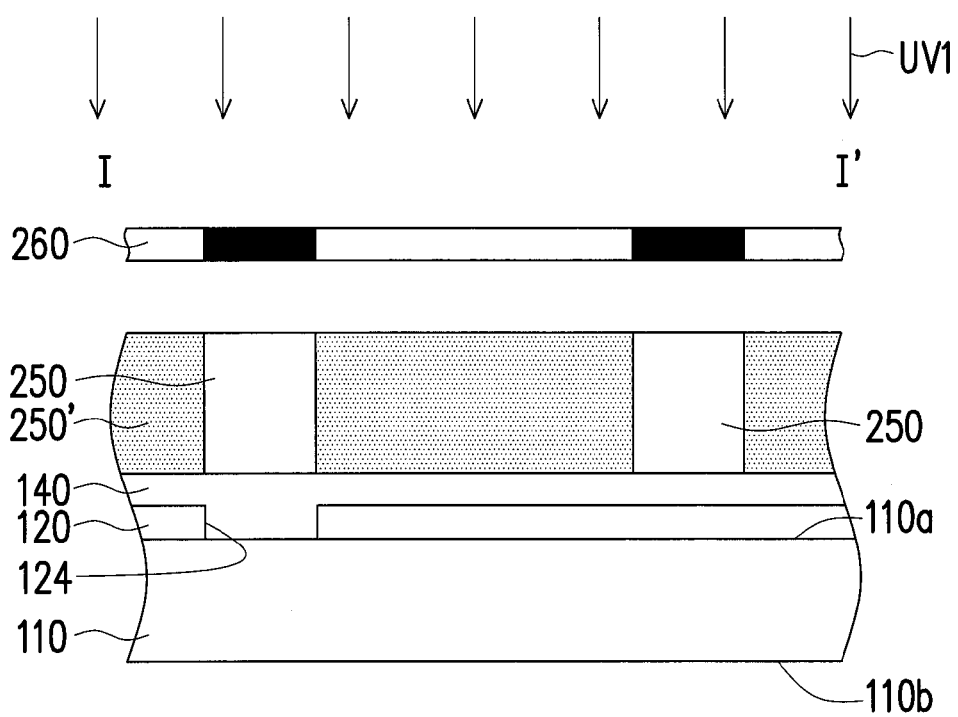
Figure 4C:
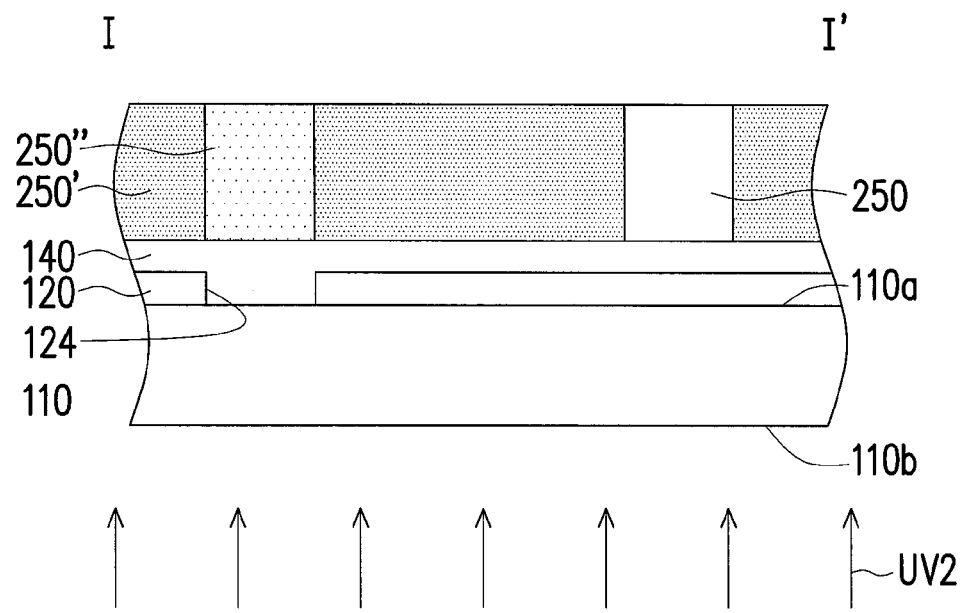
Figure 4D:
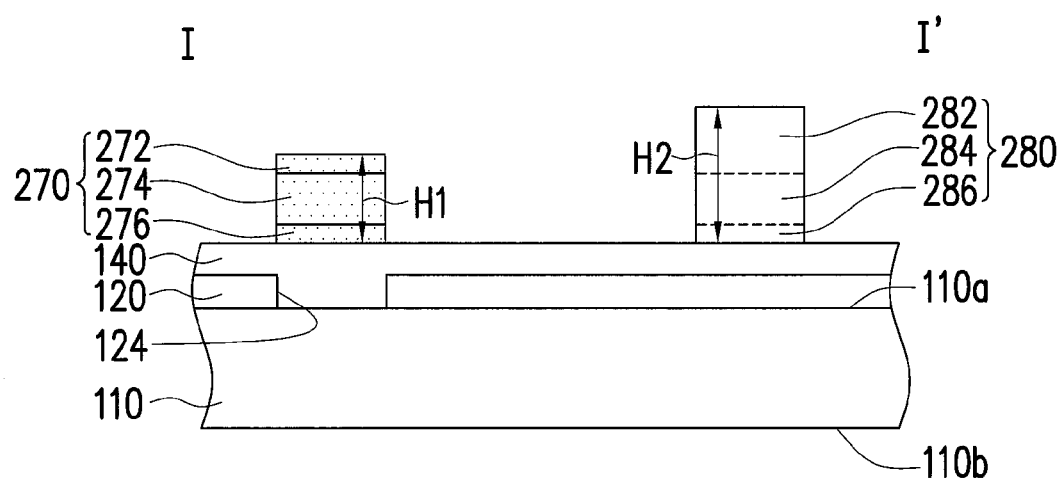

Next, as shown in FIG. 4B to FIG. 4D, an exposure process and a development process are performed on the photoresist material layer 250 to form the first spacers 270 and the second spacers 280 on the substrate 110. In the following paragraphs, Steps (a), (b), and (c) included in the exposure process and the development process performed on the photoresist material layer 250 are explained in detail.

With reference to FIG. 4B, Step (a) is to provide a mask 260 on the photoresist material layer 250, so as to perform the exposure UV1 on the photoresist material layer 250 with the mask 260 as a shielding mask. Step (a) may also be called a front exposure. In this embodiment, Step (a) is a saturated exposure, and because the photoresist material layer 250 is a positive photoresist, the decomposition strength of the photosensitive material of a portion of the photoresist material layer 250 that receives the exposure UV1 is increased (i.e. functional groups reactive to a developer increase) to form a photoresist material layer 250' that is development-intolerant (i.e. will be removed in the development step). Further, a portion of a vertical projection of the photoresist material layer 250 that does not receive the exposure UV1 respectively overlaps the first exposure opening 124, and another portion of the vertical projection is located outside the first exposure opening 124 respectively.

With reference to FIG. 4C, Step (b) is to perform an exposure UV2 on the photoresist material layer 250 with the patterned light-shielding layer 120 as a shielding mask. Step (b) may also be called a back exposure. In this embodiment, Step (b) is an unsaturated exposure, and because the photoresist material layer 250 is a positive photoresist, the decomposition strength of the photosensitive material of a portion of the photoresist material layer 250 that receives the exposure UV2 is slightly increased (i.e. functional groups reactive to the developer slightly increase) to form a photoresist material layer 250" that has weak development resistance (i.e. will be partially removed in the development step).

With reference to FIG. 4D, Step (c) is to develop the photoresist material layer 250 after the exposure UV2. Step (c) may also be called a development. In this embodiment, the development-intolerant photoresist material layer 250' is removed completely, the photoresist material layer 250" that has weak development resistance is partially removed, and the photoresist material layer 250 that does not receive the exposures UV1 and UV2 is not removed. Therefore, in Step (c), the photoresist material layer 250" that is not removed forms the first spacers 270, and the photoresist material layer 250 that is not removed forms the second spacers 280. Accordingly, a plurality of the first spacers 270 are formed by Step (a), Step (b), and Step (c), and the vertical projections of the first spacers 270 respectively overlap the first exposure openings 124. A plurality of the second spacers 280 are formed by Step (a) and Step (c), and the vertical projections of the second spacers 280 are respectively outside the first exposure openings 124. In addition, each of the first spacers 270 has the top portion 272, the connection portion 274, and the bottom portion 276, and each of the second spacers 280 has the top portion 282, the connection portion 284, and the bottom portion 286.

In this embodiment, because the first spacers 270 only receive the unsaturated back exposure, the relationship between the decomposition strengths of the photosensitive material of the first spacers 270 is: the bottom portion 276>the connection portion 274>the top portion 272. Furthermore, because the second spacers 280 do not receive the front exposure or the back exposure, the relationship between the decomposition strengths of the photosensitive material of the second spacers 280 is: the bottom portion 286=the connection portion 284=the top portion 282. That is to say, because the second spacers 280 are not exposed, the second spacers 280 are all high development-resistant layers. Accordingly, after hard baking, the height H2 of the second spacer 280 is larger than the height H1 of the first spacer 270.

In the embodiment of FIG. 4A to FIG. 4D, a sequence of the steps included in the exposure process and the development process performed on the photoresist material layer 250 is Steps (a)/(b)/(c) (i.e. Step (a) precedes Step (b), and Step (c) is after Step (a) and Step (b)), for example. However, the invention is not limited thereto. In other embodiments, the sequence of the steps included in the exposure process and the development process performed on the photoresist material layer 250 may also be Steps (b)/(a)/(c) (i.e. Step (b) precedes Step (a), and Step (c) is after Step (a) and Step (b)). Various sequences of Steps (a), (b), and (c) may be inferred by those skilled in the art from the teaching of the embodiment of FIG. 4A to FIG. 4D. Thus, details are not illustrated here.

Figure 5A:
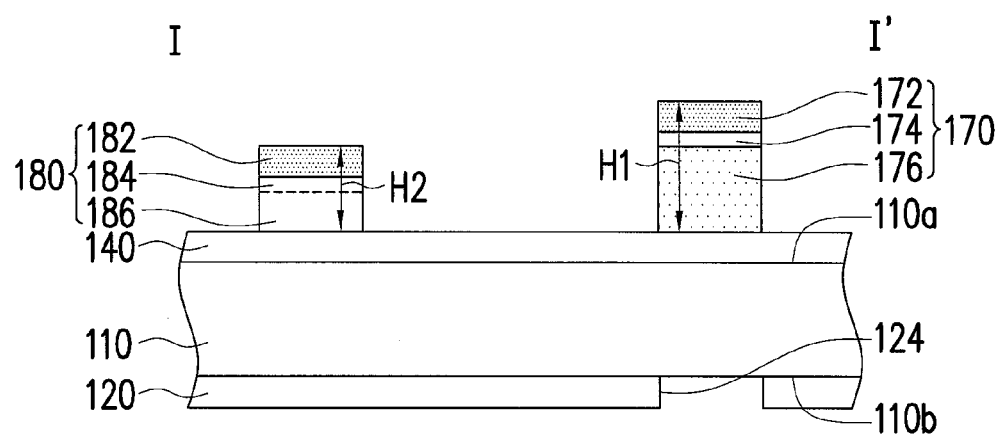
FIG. 5A and FIG. 5B are schematic cross-sectional views of device substrates according to other embodiments of the invention.
Figure 5B:
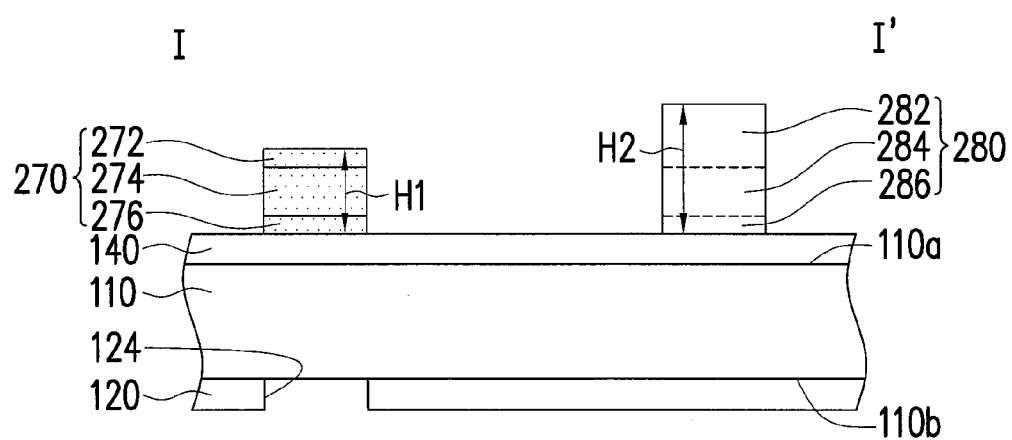

In the embodiments of FIG. 1A to FIG. 4D, the patterned light-shielding layer 120 is disposed on the first side 110a of the substrate 110, for example. However, the invention is not limited thereto. In other embodiments, the patterned light-shielding layer 120 may be disposed on the second side 110b of the substrate 110. For example, as shown in FIG. 5A, the material of the first spacers 170 and the second spacers 180 is a negative photoresist, and the patterned light-shielding layer 120 is located on the second side 110b of the substrate 110. As shown in FIG. 5B, the material of the first spacers 270 and the second spacers 280 is a positive photoresist, and the patterned light-shielding layer 120 is located on the second side 110b of the substrate 110. The embodiments of FIG. 5A and FIG. 5B are similar to the embodiments of FIG. 1A to FIG. 2D and FIG. 3A to FIG. 4D respectively. Therefore, identical or similar elements are denoted by the same or similar reference numerals, which will not be described again hereinafter. In other words, the invention does not limit whether the patterned light-shielding layer 120 is on the first side 110a or the second side 110b of the substrate 110, as long as the patterned light-shielding layer 120 can serve as the shielding mask for performing back exposure on the photoresist material layer 150 or 250.

Figure 6A:
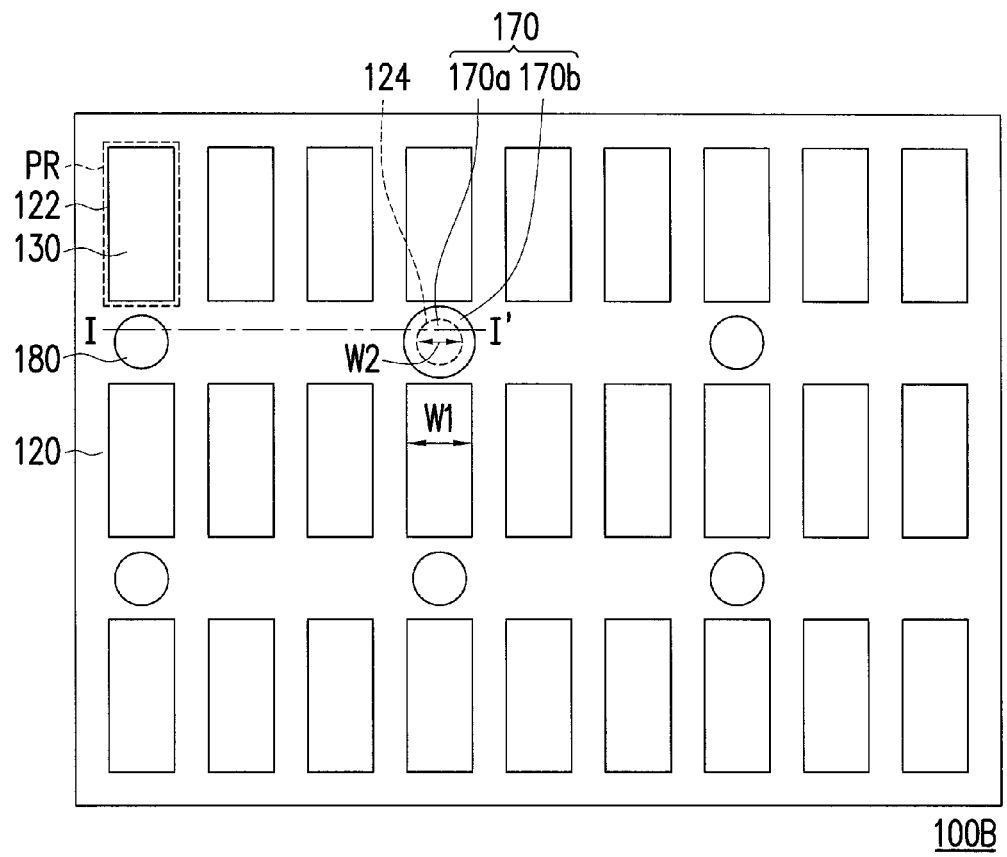
FIG. 6A is a schematic top view of a device substrate according to the third embodiment of the invention.
Figure 6B:
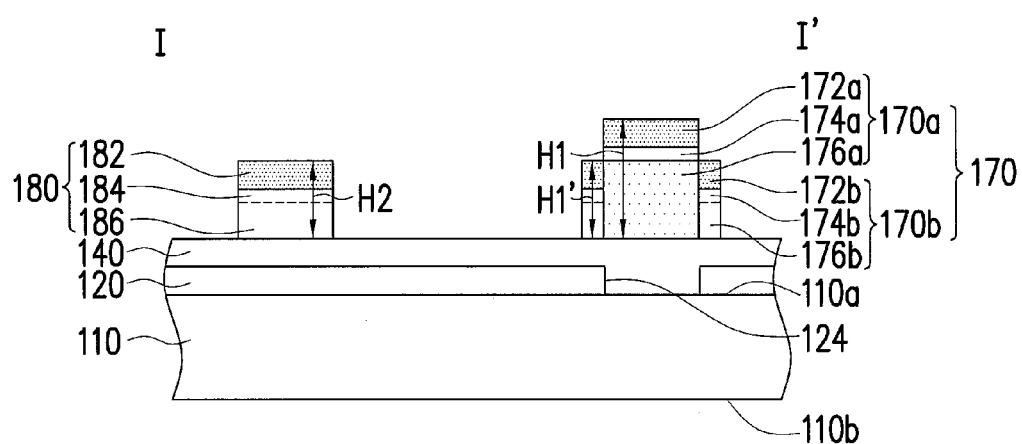
FIG. 6B is a schematic cross-sectional view of the device substrate of FIG. 6A along the line I-I'.

FIG. 6A is a schematic top view of a device substrate according to the third embodiment of the invention. FIG. 6B is a schematic cross-sectional view of the device substrate of FIG. 6A along the line I-I'. The embodiment of FIG. 6A to FIG. 6B is similar to the embodiment of FIG. 1A to FIG. 1B. Therefore, identical or similar elements are denoted by the same or similar reference numerals, which will not be described again hereinafter. With reference to FIG. 6A and FIG. 6B, a difference between the embodiment of FIG. 6A to FIG. 6B and the embodiment of FIG. 1A to FIG. 1B is that: in a device substrate 100B, each of the first spacers 170 has a first portion 170a and a second portion 170b connected with a periphery of the first portion 170a, and a height H1 of the first portion 170a is larger than a height H1' of the second portion 170b.

A plurality of the first spacers 170 and a plurality of the second spacers 180 are disposed on the substrate 110. Each of the first spacers 170 has the first portion 170a and the second portion 170b connected with the periphery of the first portion 170a. In other words, each of the first spacers 170 has the first portion 170a and the second portion 170b, wherein the second portion 170b is disposed to surround and is connected with the first portion 170a. A vertical projection of the first portion 170a on the patterned light-shielding layer 120 respectively overlaps the corresponding first exposure opening 124, and a vertical projection of the second portion 170b on the patterned light-shielding layer 120 is located outside the corresponding first exposure opening 124. The vertical projection of the second spacer 180 is located outside the first exposure opening 124 respectively. More specifically, the first spacers 170 and the second spacers 180 are disposed on the transparent layer 140. The first portion 170a is disposed corresponding to the first exposure opening 124 to cover the first exposure opening 124 while the second portion 170b and the second spacer 180 do not overlap the first exposure opening 124. In this embodiment, when the device substrate 100B is a color filter substrate of a touch display panel, the first spacers 170 are main spacers, for example, for maintaining a gap between the color filter substrate and the active device array substrate, and the second spacers 180 are secondary spacers, for example. The height H1 of the first portion 170a of each of the first spacers 170 is in a range of 1 micrometer to 6 micrometers, and preferably in a range of 2.5 micrometers to 4 micrometers, for example. Moreover, in this embodiment, the material of the first spacers 170 and the second spacers 180 is a negative photoresist. The height H1 of the first portion 170a is larger than the height H1' of the second portion 170b, and the height H1' of the second portion 170b is equal to the height H2 of the second spacer 180. A height difference (H1-H1') between the first portion 170a and the second portion 170b is larger than 0.2 micrometer, for example. In other words, the cross-sectional shape of the first spacer 170 in FIG. 6B is stepped, for example. The material of the first spacer 170 and the second spacer 180 is a photosensitive material, for example. Moreover, the invention is not intended to limit the color, size, number, shape, and cross-sectional shape of the first spacers 170 or the second spacers 180.

It is noted that each of the first portions 170a has a top portion 172a, a connection portion 174a, and a bottom portion 176a, and each of the second portions 170b has a top portion 172b, a connection portion 174b, and a bottom portion 176b. In this embodiment, a relationship between cross-linking densities (or cross-linking strengths) of the photosensitive material of the first portion 170a is: the bottom portion 176a>the top portion 172a>the connection portion 174a, and a relationship between cross-linking densities of the photosensitive material of the second portion 170b is: the top portion 172b>the connection portion 174b=the bottom portion 176b. Moreover, each of the second spacers 180 has the top portion 182, the connection portion 184, and the bottom portion 186. In this embodiment, a relationship between the cross-linking densities of the photosensitive material of the second spacer 180 is: the top portion 182>the connection portion 184=the bottom portion 186. In other words, in this embodiment, the cross-linking densities of the photosensitive materials of the second portion 170b and the second spacer 180 have the same distribution.

FIG. 7A to FIG. 7D are schematic cross-sectional views showing a fabricating method of the device substrate 100B of FIG. 6B. The embodiment of FIG. 7A to FIG. 7D is similar to the embodiment of FIG. 2A to FIG. 2D. Therefore, identical or similar elements are denoted by the same or similar reference numerals, which will not be described again hereinafter.

Figure 7A:
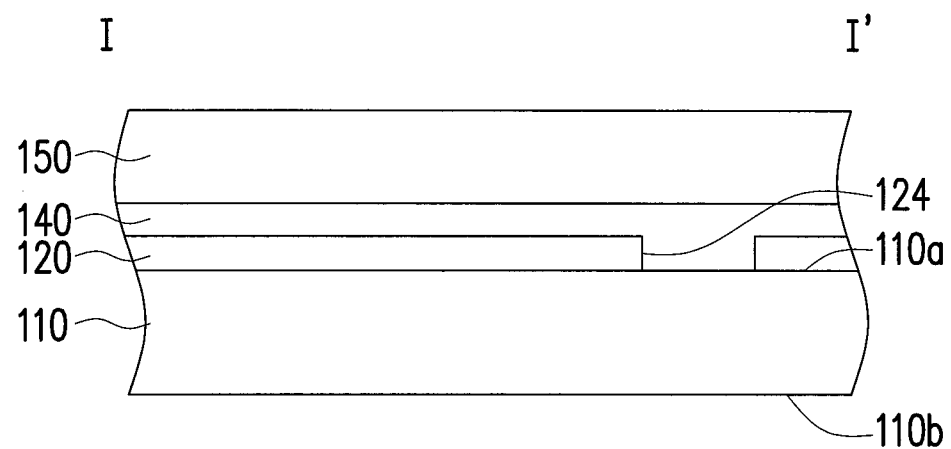
FIG. 7A to FIG. 7D are schematic cross-sectional views showing a fabricating method of the device substrate of FIG. 6B.

With reference to FIG. 7A, the structures and fabricating methods of FIG. 7A and FIG. 2A are the same. Therefore, identical elements are denoted by the same reference numerals, which will not be described again hereinafter. In this embodiment, the material of the photoresist material layer 150 includes a photosensitive material, and the photoresist material layer 150 is a negative photoresist.

Figure 7B:
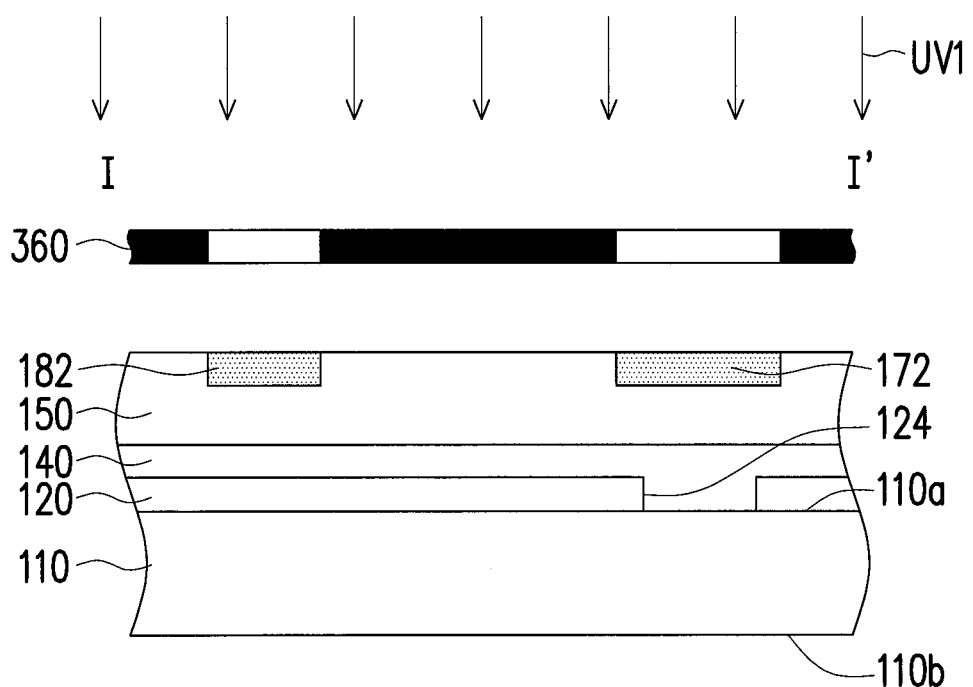
Figure 7C:
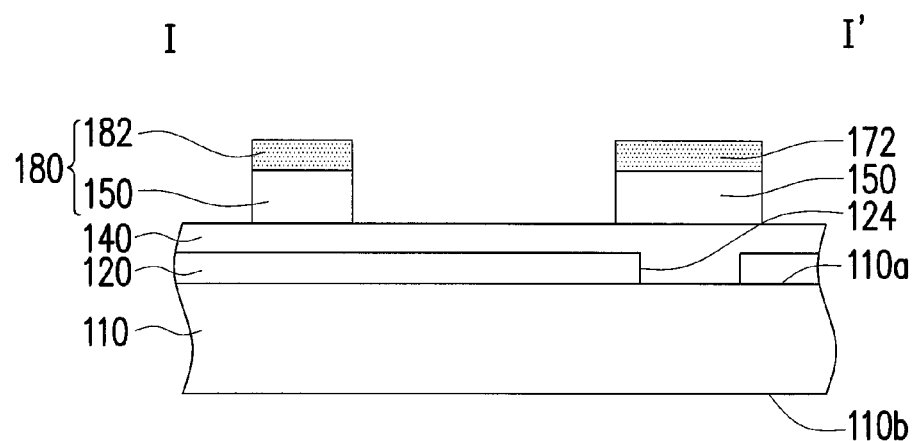
Figure 7D:
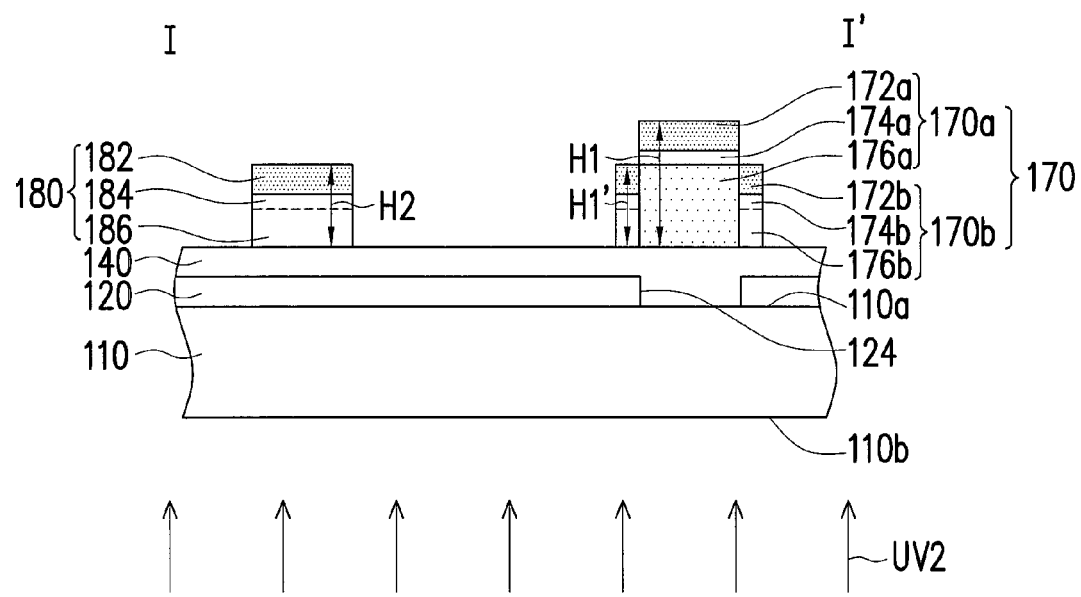

Next, as shown in FIG. 7B to FIG. 7D, an exposure process and a development process are performed on the photoresist material layer 150 to form the first spacers 170 and the second spacers 180 on the substrate 110. In the following paragraphs, Steps (a), (b), and (c) included in the exposure process and the development process performed on the photoresist material layer 150 are explained in detail.

With reference to FIG. 7B, Step (a) is to provide a mask 360 on the photoresist material layer 150, so as to perform the exposure UV1 on the photoresist material layer 150 with the mask 360 as a shielding mask. Step (a) may also be called a front exposure. In this embodiment, Step (a) is an unsaturated exposure, and because the photoresist material layer 150 is a negative photoresist, the cross-linking density of the photosensitive material of a portion of the photoresist material layer 150 that receives the exposure UV1 is increased to form the top portion 172 and the top portion 182 that are high development-resistant (i.e. will not be removed in the development step). A vertical projection of the top portion 172 respectively overlaps the first exposure opening 124, and a size of the top portion 172 is larger than the size of the first exposure opening 124. A vertical projection of the top portion 182 is located outside the first exposure opening 124 respectively.

With reference to FIG. 7C, Step (b) is to develop the photoresist material layer 150 after the exposure UV1. Step (b) may also be called a development. In this embodiment, because the top portion 172 and top portion 182 which has high development-resistant cover a portion of the photoresist material layer 150, the portion of the photoresist material layer 150 covered by the top portion 172 and the top portion 182 is not removed in Step (b) while the uncovered portion of the photoresist material layer 150 is removed. A plurality of the second spacers 180 are formed by Step (a) and Step (b), and the vertical projections of the second spacers 180 are respectively outside the first exposure openings 124.

With reference to FIG. 7D, Step (c) is to perform an exposure UV2 on the photoresist material layer 150 with the patterned light-shielding layer 120 as a shielding mask. Step (c) may also be called a back exposure. In this embodiment, Step (c) is a saturated exposure, and because the photoresist material layer 150 is a negative photoresist, the cross-linking density of the photosensitive material of a portion of the photoresist material layer 150 that receives the exposure UV2 is increased to form the bottom portion 176a. In Step (c), a portion of the photoresist material layer 150 that does not receive the exposure UV2 forms the connection portion 174a, the connection portion 174b, and the bottom portion 176b. Accordingly, a plurality of the first spacers 170 are formed by Step (a), Step (b), and Step (c), and each of the first spacers 170 has the first portion 170a and the second portion 170b connected with the periphery of the first portion 170a. The vertical projection of the first portion 170a on the patterned light-shielding layer 120 respectively overlaps the corresponding first exposure opening 124, and the vertical projection of the second portion 170b on the patterned light-shielding layer 120 is located outside the corresponding first exposure opening 124. Moreover, each of the first portions 170a has the top portion 172a, the connection portion 174a, and the bottom portion 176a, and each of the second portions 170b has the top portion 172b, the connection portion 174b, and the bottom portion 176b.

In this embodiment, because the second spacers 180 only receive the unsaturated front exposure, the relationship between the cross-linking densities of the photosensitive material of the second spacers 180 is: the top portion 182>the connection portion 184=the bottom portion 186. Further, because the first portions 170a of the first spacers 170 receive the unsaturated front exposure and saturated back exposure, the relationship between the cross-linking densities of the photosensitive material of the first portions 170a is: the bottom portion 176a>the top portion 172a>the connection portion 174a. Because the second portions 170b of the first spacers 170 only receive the unsaturated front exposure, the relationship between the cross-linking densities of the photosensitive material of the second portions 170b is: the top portion 172b>the connection portion 174b=the bottom portion 176b. Accordingly, after hard baking, the height H1 of the first portion 170a is larger than the height H1' of the second portion 170b, and the height H1' of the second portion 170b is equal to the height H2 of the second spacer 180. In other words, after hard baking, the height H1 of the first portion 170a of the first spacer 170 is larger than the height H2 of the second spacer 180.

In the embodiment of FIG. 7A to FIG. 7D, a sequence of the steps included in the exposure process and the development process performed on the photoresist material layer 150 is Steps (a)/(b)/(c), for example. However, the invention is not limited thereto. In other embodiments, the sequence of the steps included in the exposure process and the development process performed on the photoresist material layer 150 may also be Steps (c)/(b)/(a), Steps (a)/(c)/(b), or Steps (c)/(a)/(b), as long as Step (a) precedes Step (c) or Step (c) precedes Step (a). Various sequences of Steps (a), (b), and (c) may be inferred by those skilled in the art from the teaching of the embodiment of FIG. 7A to FIG. 7D. Thus, details are not illustrated here.

Figure 8A:
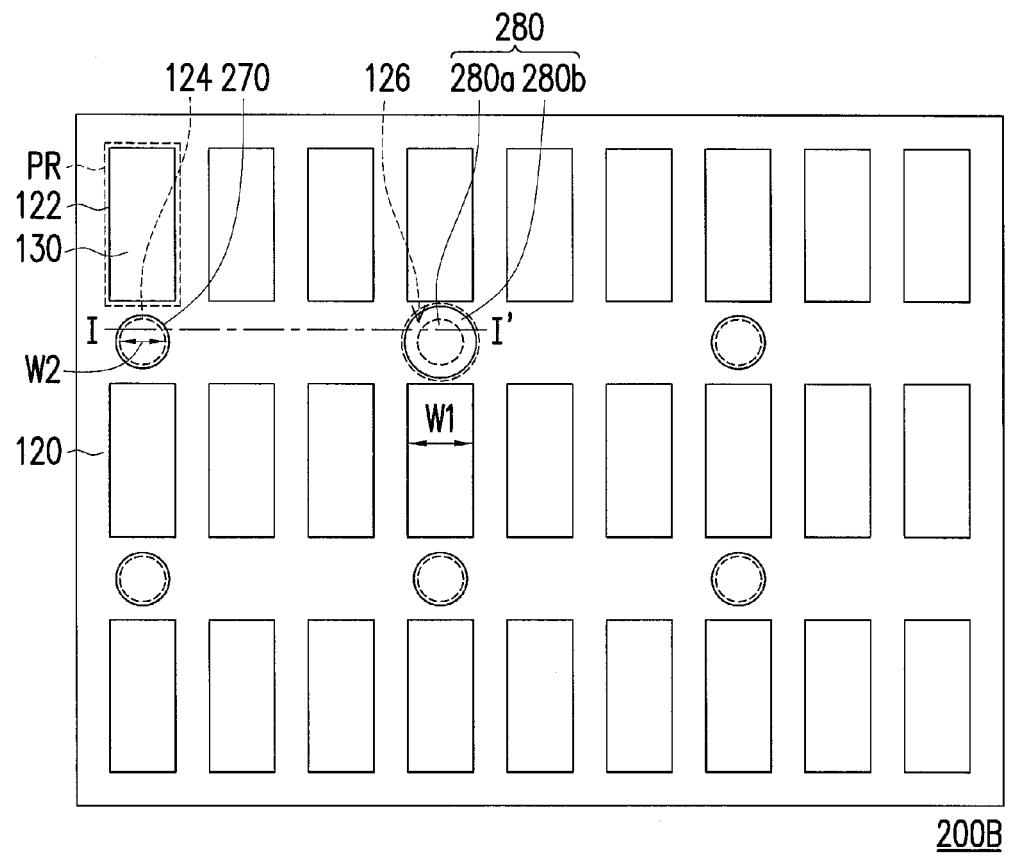
FIG. 8A is a schematic top view of a device substrate according to the fourth embodiment of the invention.
Figure 8B:
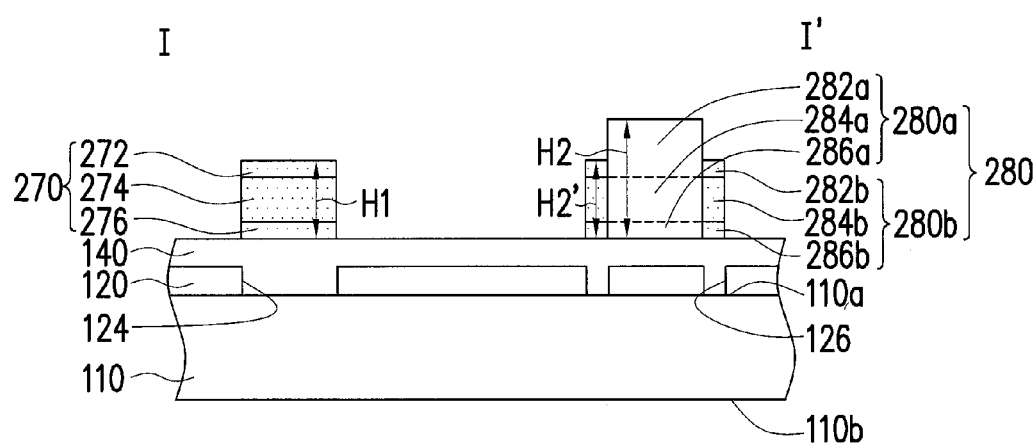
FIG. 8B is a schematic cross-sectional view of the device substrate of FIG. 8A along the line I-I'.

FIG. 8A is a schematic top view of a device substrate according to the fourth embodiment of the invention. FIG. 8B is a schematic cross-sectional view of the device substrate of FIG. 8A along the line I-I'. The embodiment of FIG. 8A to FIG. 8B is similar to the embodiment of FIG. 3A to FIG. 3B. Therefore, identical or similar elements are denoted by the same or similar reference numerals, which will not be described again hereinafter. With reference to FIG. 8A and FIG. 8B, a difference between the embodiment of FIG. 8A to FIG. 8B and the embodiment of FIG. 3A to FIG. 3B is that: in a device substrate 200B, each of the second spacers 280 has a first portion 280a and a second portion 280b connected with a periphery of the first portion 280a, and a height H2 of the first portion 280a is larger than a height H2' of the second portion 280b. Moreover, the patterned light-shielding layer 120 further has a plurality of second exposure openings 126.

Each of the second exposure openings 126 is located between two adjacent pixel openings 122. In this embodiment, a shape of the second exposure opening 126 is a circular annular opening, for example. However, the invention is not limited thereto. In other embodiments, the shape of the second exposure opening 126 in FIG. 8A may be an annular opening (ring) of circular, elliptic, rectangular, square, triangular, rhombic, polygonal, or may be an annular opening of other suitable shapes, for example.

A plurality of the first spacers 270 and a plurality of the second spacers 280 are disposed on the substrate 110. The vertical projection of the first spacer 270 respectively overlaps the first exposure opening 124. Each of the second spacers 280 includes the first portion 280a and the second portion 280b connected with the periphery of the first portion 280a. The vertical projection of the first portion 280a on the patterned light-shielding layer 120 is located outside the corresponding first exposure opening 124 and second exposure opening 126, and the vertical projection of the second portion 280b on the patterned light-shielding layer 120 respectively overlaps the corresponding second exposure opening 126. More specifically, the first spacers 270 and the second spacers 280 are disposed on the transparent layer 140. The first spacers 270 are disposed corresponding to the first exposure openings 124 to cover the first exposure openings 124. The second portion 280a is disposed corresponding to the second exposure opening 126 to cover the second exposure opening 126 while the first portion 280a does not overlap the first exposure opening 124 and the second exposure opening 126. In this embodiment, when the device substrate 200B is a color filter substrate of a touch display panel, the first spacers 270 are secondary spacers and the second spacers 280 are main spacers, for example, for maintaining a gap between the color filter substrate and the active device array substrate. The height H2 of the first portion 280a of each of the second spacers 280 is in a range of 1 micrometer to 6 micrometers, and preferably in a range of 2.5 micrometers to 4 micrometers, for example. Moreover, in this embodiment, the material of the first spacers 270 and the second spacers 280 is a positive photoresist. The height H2 of the first portion 280a is larger than the height H2' of the second portion 280b, and the height H2' of the second portion 280b is equal to the height H1 of the first spacer 270. A height difference (H2-H2') between the first portion 280a and the second portion 280b is larger than 0.2 micrometer, for example. In other words, the cross-sectional shape of the second spacer 280 in FIG. 8B is stepped, for example. The material of the first spacer 270 and the second spacer 280 is a photosensitive material, for example. Moreover, the invention is not intended to limit the color, size, number, shape, and cross-sectional shape of the first spacers 270 or the second spacers 280.

It is also noted that each of the first spacers 270 has the top portion 272, the connection portion 274, and the bottom portion 276. In this embodiment, the relationship between the decomposition strengths of the photosensitive material of the first spacer 270 is: the bottom portion 276>the connection portion 274>the top portion 272. Each of the first portions 280a has a top portion 282a, a connection portion 284a, and a bottom portion 286a, and each of the second portions 280b has a top portion 282b, a connection portion 284b, and a bottom portion 286b. In this embodiment, a relationship between decomposition strengths of the photosensitive material of the first portion 280a is: the bottom portion 286a=the connection portion 284a=the top portion 282a (i.e. no exposure; all are development-resistant layers), and a relationship between decomposition strengths of the photosensitive material of the second portion 280b is: the bottom portion 286b>the connection portion 284b>the top portion 282b (i.e. functional groups reactive to the developer increase). In other words, in this embodiment, the cross-linking densities of the photosensitive materials of the second portion 280b and the first spacer 270 have the same distribution.

FIG. 9A to FIG. 9D are schematic cross-sectional views showing a fabricating method of the device substrate of FIG. 8B. The embodiment of FIG. 9A to FIG. 9D is similar to the embodiment of FIG. 4A to FIG. 4D. Therefore, identical or similar elements are denoted by the same or similar reference numerals, which will not be described again hereinafter.

Figure 9A:
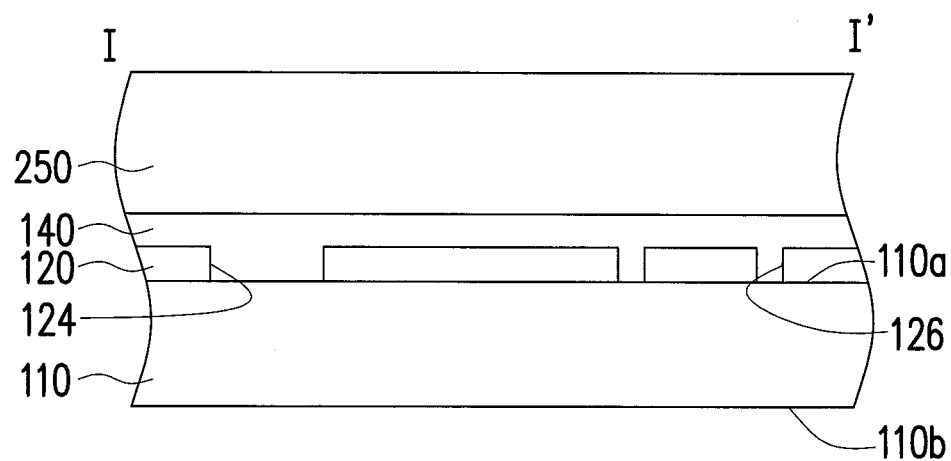
FIG. 9A to FIG. 9D are schematic cross-sectional views showing a fabricating method of the device substrate of FIG. 8B.

With reference to FIG. 9A, the structures and fabricating methods of FIG. 9A and FIG. 4A are the same. Therefore, identical or similar elements are denoted by the same or similar reference numerals, which will not be described again hereinafter. In this embodiment, the material of the photoresist material layer 250 includes a photosensitive material, and the photoresist material layer 250 is a positive photoresist. Moreover, the patterned light-shielding layer 120 further has a plurality of the second exposure openings 126, and the transparent layer 140 is also filled in the second exposure openings 126.

Figure 9B:
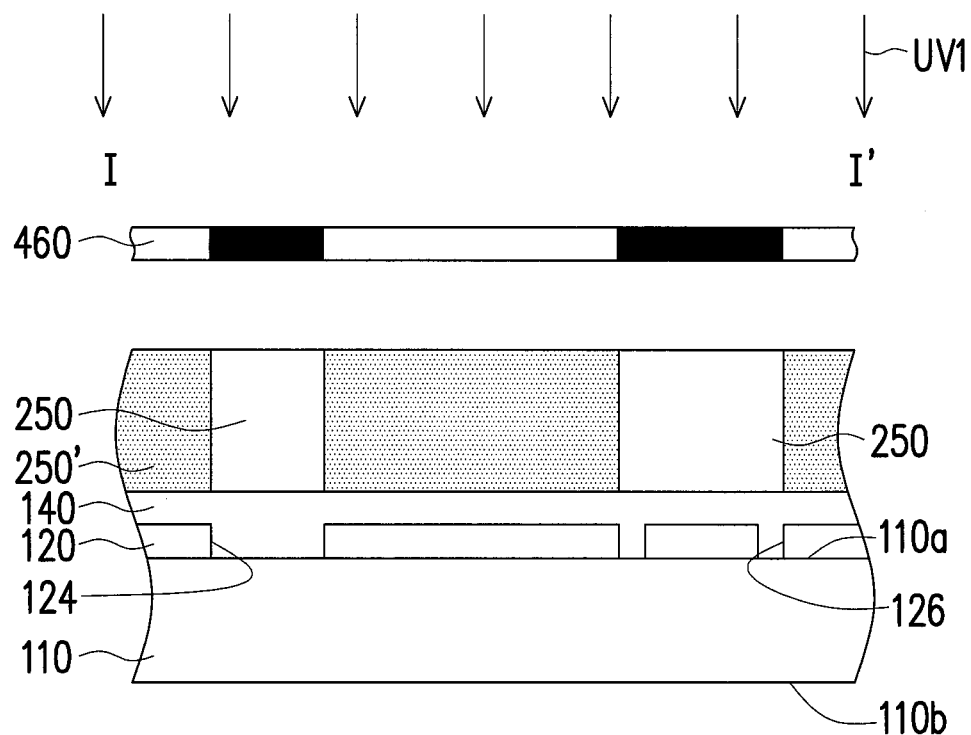
Figure 9C:
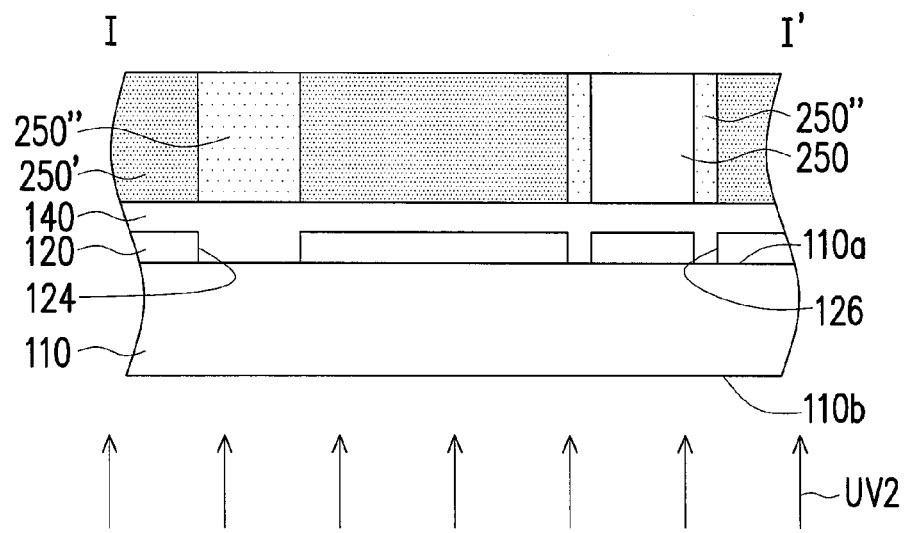
Figure 9D:
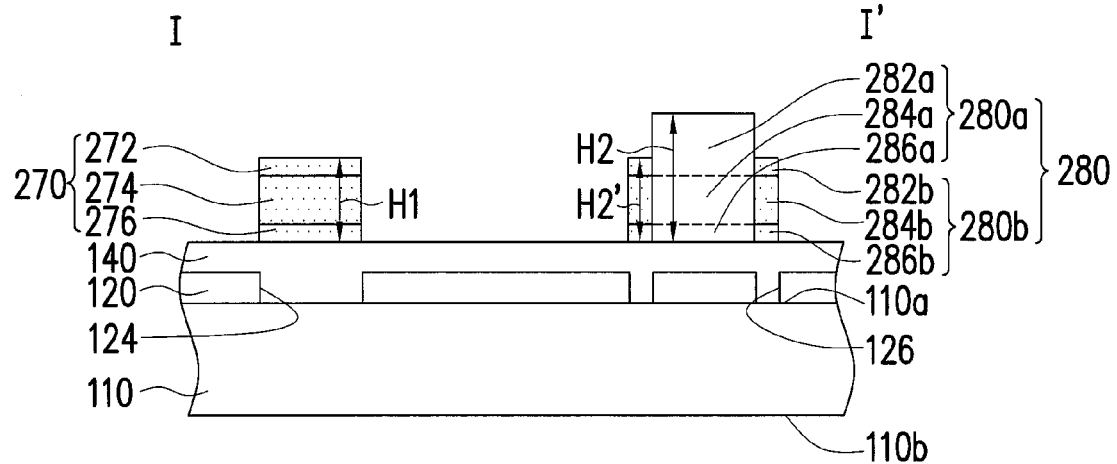

Next, as shown in FIG. 9B to FIG. 9D, an exposure process and a development process are performed on the photoresist material layer 250 to form the first spacers 270 and the second spacers 280 on the substrate 110. In the following paragraphs, Steps (a), (b), and (c) included in the exposure process and the development process performed on the photoresist material layer 250 are explained in detail.

With reference to FIG. 9B, Step (a) is to provide a mask 460 above the photoresist material layer 250, so as to perform the exposure UV1 on the photoresist material layer 250 with the mask 460 as a shielding mask. Step (a) may also be called a front exposure. In this embodiment, Step (a) is a saturated exposure, and because the photoresist material layer 250 is a positive photoresist, the decomposition strength of the photosensitive material of a portion of the photoresist material layer 250 that receives the exposure UV1 is increased (i.e. functional groups reactive to the developer increase) to form the photoresist material layer 250' that is development-intolerant (i.e. will be removed in the development step). Further, a portion of a vertical projection of the photoresist material layer 250 that does not receive the exposure UV1 respectively overlaps the first exposure opening 124, and a portion of the vertical projection respectively overlaps the second exposure opening 126. Other portions of the vertical projection are located outside the first exposure opening 124 and the second exposure opening 126 respectively.

With reference to FIG. 9C, Step (b) is to perform the exposure UV2 on the photoresist material layer 250 with the patterned light-shielding layer 120 as a shielding mask. Step (b) may also be called a back exposure. In this embodiment, Step (b) is an unsaturated exposure, and because the photoresist material layer 250 is a positive photoresist, the decomposition strength of the photosensitive material of a portion of the photoresist material layer 250 that receives the exposure UV2 is slightly increased (i.e. functional groups reactive to the developer slightly increase) to form the photoresist material layer 250" that has weak development resistance (i.e. will be partially removed in the development step).

With reference to FIG. 9D, Step (c) is to develop the photoresist material layer 250 after the exposure UV2. Step (c) may also be called a development. In this embodiment, the development-intolerant photoresist material layer 250' is removed completely, the photoresist material layer 250" that has weak development resistance is partially removed, and the photoresist material layer 250 that does not receive the exposures UV1 and UV2 is not removed. Therefore, in Step (c), the photoresist material layer 250" that is not removed forms the first spacers 270 and the second portions 280b of the second spacers 280, and the photoresist material layer 250 that is not removed forms the first portions 280a of the second spacers 280. Accordingly, a plurality of the first spacers 270 and a plurality of the second spacers 280 are formed by Step (a), Step (b), and Step (c). The vertical projection of the first spacer 270 respectively overlaps the first exposure opening 124. Each of the second spacers 280 includes the first portion 280a and the second portion 280b connected with the periphery of the first portion 280a. The vertical projection of the first portion 280a on the patterned light-shielding layer 120 is located outside the corresponding first exposure opening 124 and second exposure opening 126, and the vertical projection of the second portion 280b on the patterned light-shielding layer 120 respectively overlaps the corresponding second exposure opening 126. Furthermore, each of the first spacers 270 has the top portion 272, the connection portion 274, and the bottom portion 276. Each of the first portions 280a has the top portion 282a, the connection portion 284a, and the bottom portion 286a, and each of the second portions 280b has the top portion 282b, the connection portion 284b, and the bottom portion 286b.

In this embodiment, because the first spacers 270 only receive the unsaturated back exposure, the relationship between the decomposition strengths of the photosensitive material of the first spacers 270 is: the bottom portion 276>the connection portion 274>the top portion 272. Further, because the first portions 280a of the second spacers 280 do not receive the front exposure or back exposure, the relationship between the decomposition strengths of the photosensitive material of the first portions 280a is: the bottom portion 286a=the connection portion 284a=the top portion 282a. Because the second portions 280b of the second spacers 280 only receive the unsaturated back exposure, the relationship between the decomposition strengths of the photosensitive material of the second portions 280b is: the bottom portion 286b>the connection portion 284b>the top portion 282b. Accordingly, after hard baking, the height H2 of the first portion 280a is larger than the height H2' of the second portion 280b, and the height H2' of the second portion 280b is equal to the height H1 of the first spacer 270. In other words, after hard baking, the height H2 of the first portion 280a of the second spacer 280 is larger than the height H1 of the first spacer 270.

In the embodiment of FIG. 9A to FIG. 9D, a sequence of the steps included in the exposure process and the development process performed on the photoresist material layer 250 is Steps (a)/(b)/(c) (i.e. Step (a) precedes Step (b), and Step (c) is after Step (a) and Step (b)), for example. However, the invention is not limited thereto. In other embodiments, the sequence of the steps included in the exposure process and the development process performed on the photoresist material layer 250 may also be Steps (b)/(a)/(c) (i.e. Step (b) precedes Step (a), and Step (c) is after Step (a) and Step (b)). Various sequences of Steps (a), (b), and (c) may be inferred by those skilled in the art from the teaching of the embodiment of FIG. 9A to FIG. 9D. Thus, details are not illustrated here.

Figure 10A:
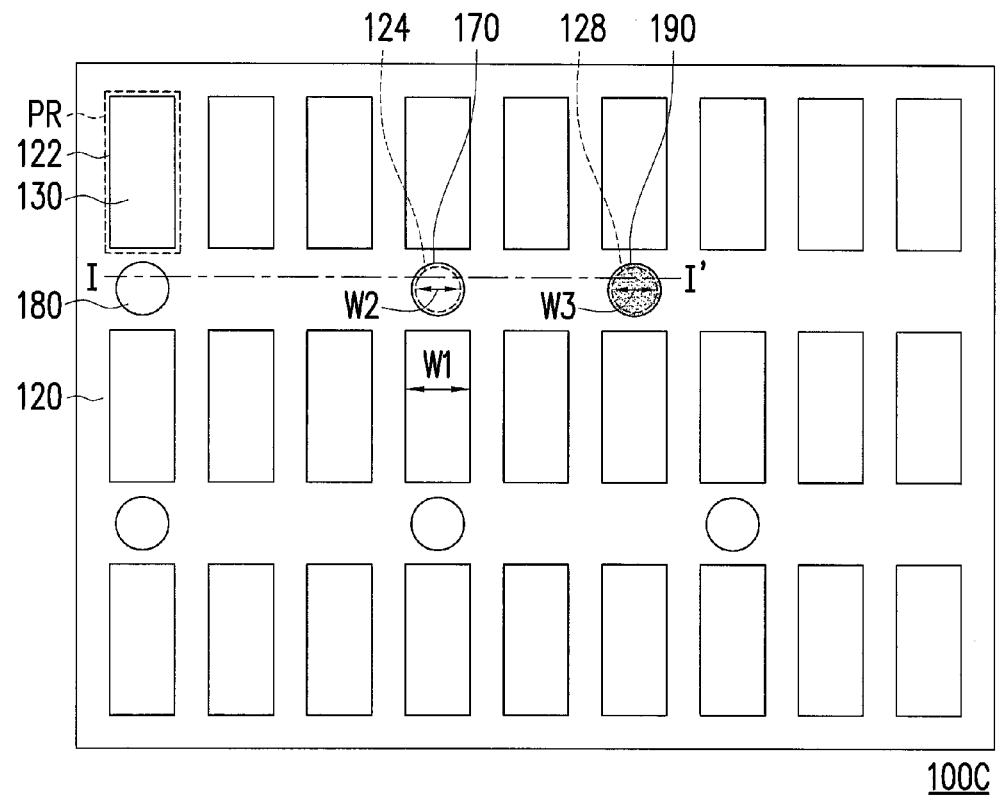
FIG. 10A is a schematic top view of a device substrate according to the fifth embodiment of the invention.
Figure 10B:
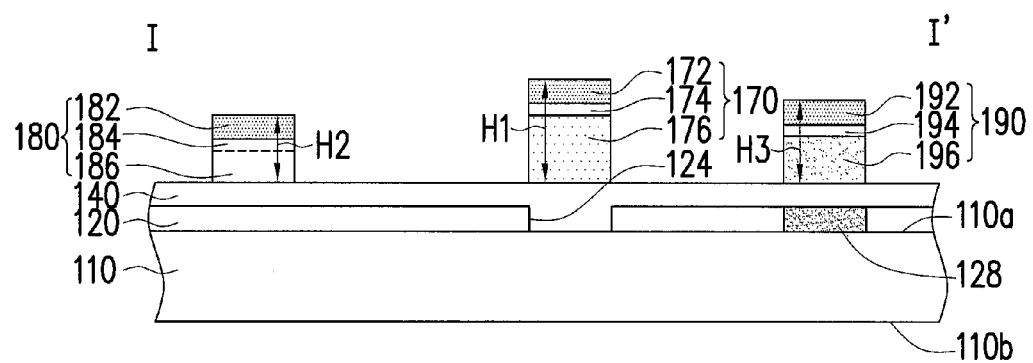
FIG. 10B is a schematic cross-sectional view of the device substrate of FIG. 10A along the line I-I'.

FIG. 10A is a schematic top view of a device substrate according to the fifth embodiment of the invention. FIG. 10B is a schematic cross-sectional view of the device substrate of FIG. 10A along the line I-I'. The embodiment of FIG. 10A to FIG. 10B is similar to the embodiment of FIG. 1A to FIG. 1B. Therefore, identical or similar elements are denoted by the same or similar reference numerals, which will not be described again hereinafter. With reference to FIG. 10A and FIG. 10B, a difference between the embodiment of FIG. 10A to FIG. 10B and the embodiment of FIG. 1A to FIG. 1B is that: a device substrate 100C further includes a plurality of third spacers 190, and a height H3 of the third spacer 190 is between the height H1 of the first spacer 170 and the height H2 of the second spacer 180. Moreover, the patterned light-shielding layer 120 further has a plurality of translucent patterns 128.

Each of the translucent patterns 128 is located between two adjacent pixel openings 122. In this embodiment, a shape of the translucent pattern 128 is circular and a width W3 thereof (i.e. diameter) is in a range of 4 micrometers to 40 micrometers, for example. However, it is noted that the invention is not limited thereto. The scope of the invention covers various embodiments as long as one of the translucent patterns 128 (or the first exposure openings 124) and one of the pixel openings 122 have different areas and/or shapes. The shape of the translucent pattern 128 in FIG. 10A may be circular, elliptic, rectangular, square, triangular, rhombic, polygonal, or other suitable shapes, for example. In this embodiment, a material of the translucent pattern 128 is the same as the material of one of the color filter patterns 130, for example, and the translucent pattern 128 and the color filter pattern 130 may belong to the same layer. That is, the translucent pattern 128 may be a red filter film, a green filter film, or a blue filter film. However, it is noted that the invention is not limited thereto. In other embodiments, the material of the translucent pattern 128 may be different from the material of the color filter pattern 130, or the translucent pattern 128 and the color filter pattern 130 may belong to different layers. A transmittance of the translucent pattern 128 is lower than a transmittance of the first exposure opening 124.

The third spacers 190 are disposed on the substrate 110, and vertical projections of the third spacers 190 on the patterned light-shielding layer 120 respectively overlap the translucent patterns 128. More specifically, the third spacers 190 are disposed on the transparent layer 140 corresponding to the translucent patterns 128, so as to cover the translucent patterns 128. In this embodiment, when the device substrate 100C is a color filter substrate of a touch display panel, the third spacers 190 are main spacers or secondary spacers, for example. Moreover, in this embodiment, the material of the first spacers 170, the second spacers 180, and the third spacers 190 is a negative photoresist. The height H1 of the first spacer 170 is larger than the height H2 of the second spacer 180, and the height H3 of the third spacer 190 is between the height H1 of the first spacer 170 and the height H2 of the second spacer 180. The material of the third spacer 190 is a photosensitive material, for example. Moreover, the invention is not intended to limit the color, size, number, shape, and cross-sectional shape of the third spacers 190.

It is noted that each of the third spacers 190 has a top portion 192, a connection portion 194, and a bottom portion 196. The bottom portion 196 is a portion close to the translucent pattern 128, the top portion 192 is a portion away from the translucent pattern 128, and the connection portion 194 is located between the top portion 192 and the bottom portion 196. In this embodiment, a relationship between cross-linking densities (or cross-linking strengths) of the photosensitive material of the third spacer 190 is: the bottom portion 196>the top portion 192>the connection portion 194.

FIG. 11A to FIG. 11D are schematic cross-sectional views showing a fabricating method of the device substrate of FIG. 10B. The embodiment of FIG. 11A to FIG. 11D is similar to the embodiment of FIG. 2A to FIG. 2D. Therefore, identical or similar elements are denoted by the same or similar reference numerals, which will not be described again hereinafter.

Figure 11A:
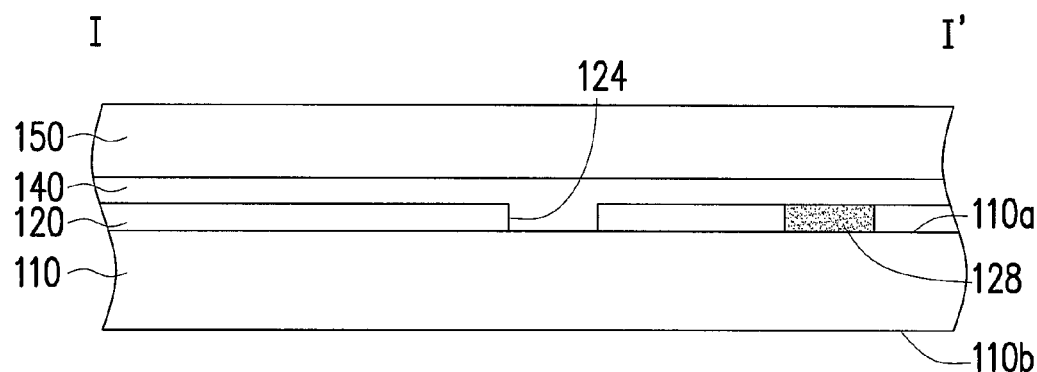
FIG. 11A to FIG. 11D are schematic cross-sectional views showing a fabricating method of the device substrate of FIG. 10B.

With reference to FIG. 11A, the structures and fabricating methods of FIG. 11A and FIG. 2A are the same or similar. Therefore, identical or similar elements are denoted by the same or similar reference numerals, which will not be described again hereinafter. In this embodiment, the material of the photoresist material layer 150 includes a photosensitive material, and the photoresist material layer 150 is a negative photoresist. Further, the patterned light-shielding layer 120 further has a plurality of the translucent patterns 128, and each of the translucent patterns 128 (or the first exposure openings 124) and each of the pixel openings 122 have different areas and/or shapes. In this embodiment, the translucent patterns 128 and one of the color filter patterns 130 are formed in the same fabricating step, for example. However, it is noted that the invention is not limited thereto. In other embodiments, the translucent patterns 128 may be a layer that is formed additionally. Moreover, the transparent layer 140 also covers the translucent patterns 128.

Figure 11B:
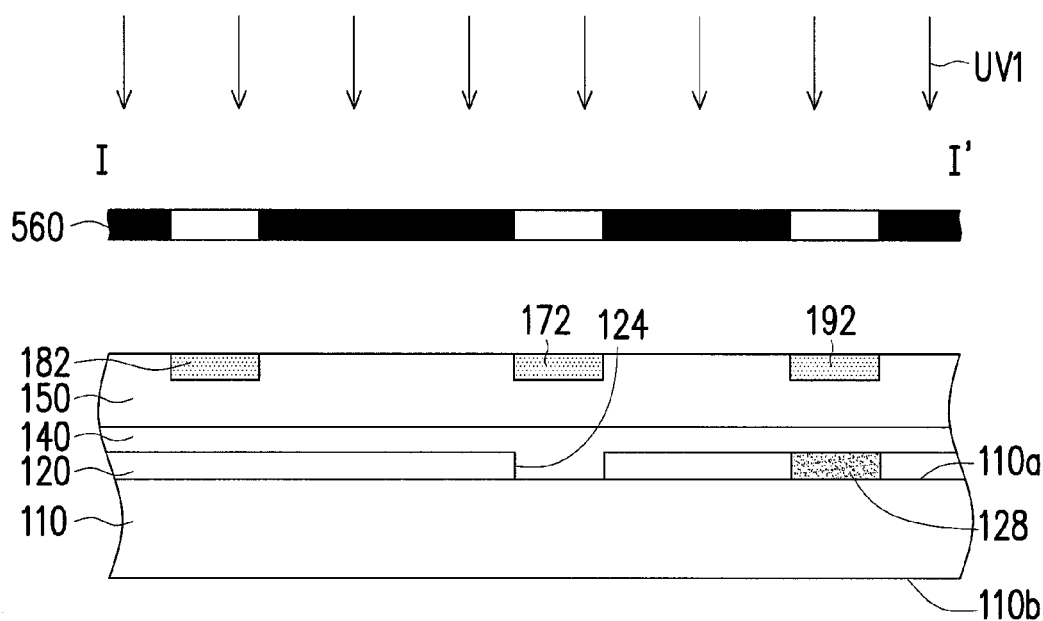
Figure 11C:
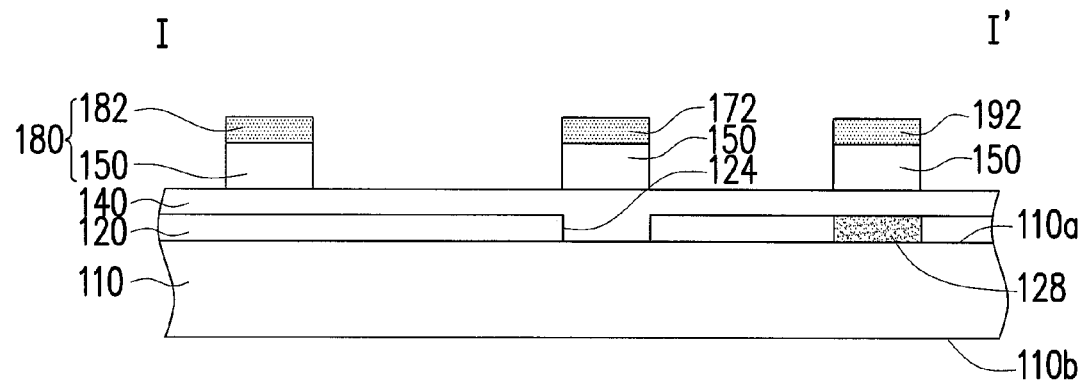
Figure 11D:
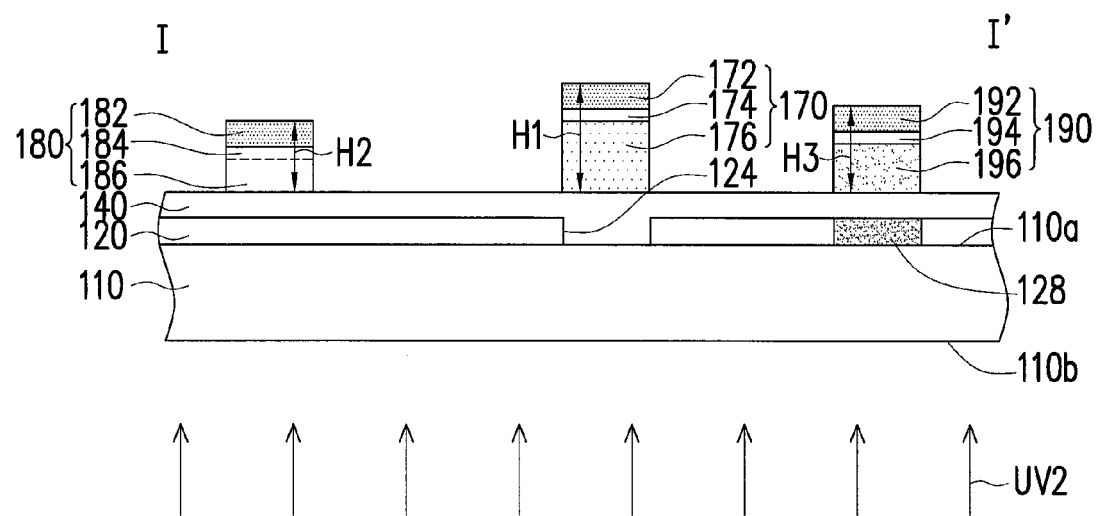

Next, as shown in FIG. 11B to FIG. 11D, an exposure process and a development process are performed on the photoresist material layer 150 to form the first spacers 170, the second spacers 180, and the third spacers 190 on the substrate 110. In the following paragraphs, Steps (a), (b), and (c) included in the exposure process and the development process performed on the photoresist material layer 150 are explained in detail.

With reference to FIG. 11B, Step (a) is to provide a mask 560 on the photoresist material layer 150, so as to perform the exposure UV1 on the photoresist material layer 150 with the mask 560 as a shielding mask. Step (a) may also be called a front exposure. In this embodiment, Step (a) is an unsaturated exposure, and because the photoresist material layer 150 is a negative photoresist, the cross-linking density of the photosensitive material of a portion of the photoresist material layer 150 that receives the exposure UV1 is increased to form the top portion 172, the top portion 182, and the top portion 192 that are high development-resistant (i.e. will not be removed in the development step). The vertical projection of the top portion 172 respectively overlaps the first exposure opening 124. The vertical projection of the top portion 182 is located outside the first exposure opening 124 and the translucent pattern 128 respectively. The vertical projection of the top portion 192 respectively overlaps the translucent pattern 128.

With reference to FIG. 11C, Step (b) is to develop the photoresist material layer 150 after the exposure UV1. Step (b) may also be called a development. In this embodiment, the portion of the photoresist material layer 150 covered by the top portion 172, the top portion 182, and the top portion 192 which have high development-resistant is not removed in Step (b) while the uncovered portion of the photoresist material layer 150 is removed. In Step (b), the portion of the photoresist material layer 150 that is not removed forms the connection portion 184 and the bottom portion 186. Accordingly, the second spacers 180 are formed by Step (a) and Step (b), and the vertical projections of the second spacers 180 are respectively outside the first exposure openings 124 and the translucent patterns 128.

With reference to FIG. 11D, Step (c) is to perform the exposure UV2 on the photoresist material layer 150 with the patterned light-shielding layer 120 as a shielding mask. Step (c) may also be called a back exposure. In this embodiment, Step (c) is a saturated exposure, and because the photoresist material layer 150 is a negative photoresist, the cross-linking density of the photosensitive material of a portion of the photoresist material layer 150 that receives the exposure UV2 is increased to form the bottom portion 176 and the bottom portion 196 through the first exposure openings 124 and the translucent patterns 128 respectively. In Step (c), the portion of the photoresist material layer 150 that does not receive the exposure UV2 forms the connection portion 174 and the connection portion 194. However, it is noted that the invention is not limited thereto. In other embodiments, the connection portion 174, the bottom portion 176, the connection portion 194, and the bottom portion 196 may all receive the exposure UV2. Accordingly, a plurality of the first spacers 170 and a plurality of the third spacers 190 are formed by Step (a), Step (b), and Step (c). The vertical projections of the first spacers 170 respectively overlap the first exposure openings 124, and the vertical projections of the third spacers 190 on the patterned light-shielding layer 120 respectively overlap the translucent patterns 128. In addition, each of the first spacers 170 has the top portion 172, the connection portion 174, and the bottom portion 176, and each of the third spacers 190 has the top portion 192, the connection portion 194, and the bottom portion 196.

In this embodiment, because the second spacers 180 only receive the unsaturated front exposure, the relationship between the cross-linking densities of the photosensitive material of the second spacers 180 is: the top portion 182>the connection portion 184=the bottom portion 186. Further, because the first spacers 170 receive the unsaturated front exposure and saturated back exposure, the relationship between the cross-linking densities of the photosensitive material of the first spacers 170 is: the bottom portion 176>the top portion 172>the connection portion 174. Because the third spacers 190 receive the unsaturated front exposure and saturated back exposure, the relationship between the cross-linking densities of the photosensitive material of the third spacers 190 is: the bottom portion 196>the top portion 192>the connection portion 194. In addition, because the bottom portion 176 and the bottom portion 196 are respectively formed by the exposure UV2 through the first exposure openings 124 and the translucent patterns 128, and the transmittance of the translucent patterns 128 is lower than the transmittance of the first exposure openings 124, the height H3 of the third spacer 190 is smaller than the height H1 of the first spacer 170. Accordingly, after hard baking, the height H1 of the first spacer 170 is larger than the height H2 of the second spacer 180, and the height H3 of the third spacer 190 is between the height H1 of the first spacer 170 and the height H2 of the second spacer 180.

In the embodiment of FIG. 11A to FIG. 11D, a sequence of the steps included in the exposure process and the development process performed on the photoresist material layer 150 is Steps (a)/(b)/(c), for example. However, the invention is not limited thereto. In other embodiments, the sequence of the steps included in the exposure process and the development process performed on the photoresist material layer 150 may also be Steps (c)/(b)/(a), Steps (a)/(c)/(b), or Steps (c)/(a)/(b), as long as Step (a) precedes Step (c) or Step (c) precedes Step (a). Various sequences of Steps (a), (b), and (c) may be inferred by those skilled in the art from the teaching of the embodiment of FIG. 11A to FIG. 11D. Thus, details are not illustrated here.

Figure 12A:
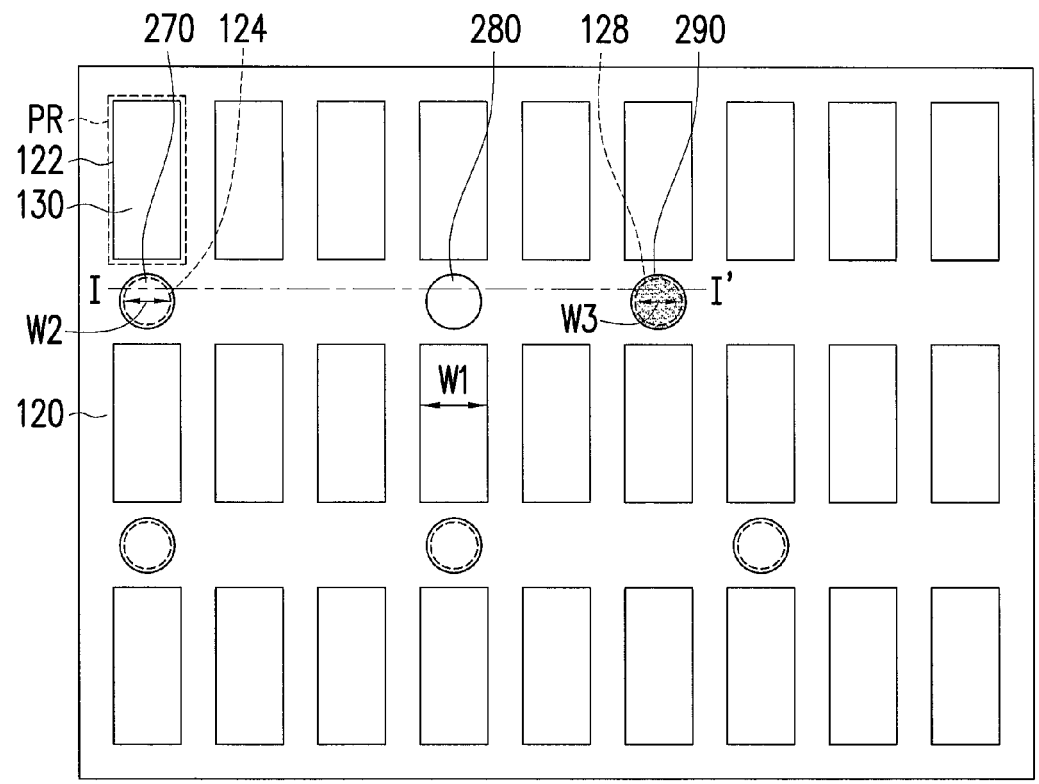
FIG. 12A is a schematic top view of a device substrate according to the sixth embodiment of the invention.
Figure 12B:
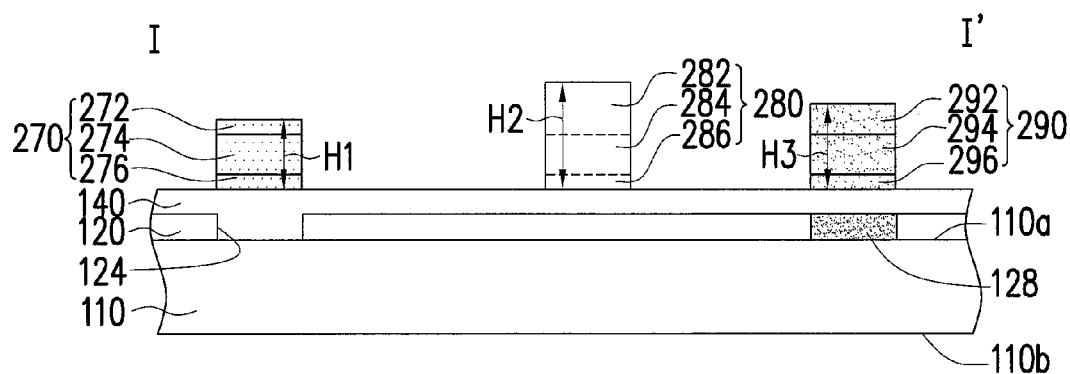
FIG. 12B is a schematic cross-sectional view of the device substrate of FIG. 12A along the line I-I'.

FIG. 12A is a schematic top view of a device substrate according to the sixth embodiment of the invention. FIG. 12B is a schematic cross-sectional view of the device substrate of FIG. 12A along the line I-I'. The embodiment of FIG. 12A to FIG. 12B is similar to the embodiment of FIG. 3A to FIG. 3B. Therefore, identical or similar elements are denoted by the same or similar reference numerals, which will not be described again hereinafter. With reference to FIG. 12A and FIG. 12B, a difference between the embodiment of FIG. 12A and FIG. 12B and the embodiment of FIG. 3A to FIG. 3B is that: a device substrate 200C further includes a plurality of third spacers 290, and a height H3 of the third spacer 290 is between the height H1 of the first spacer 270 and the height H2 of the second spacer 280. Moreover, the patterned light-shielding layer 120 further has a plurality of the translucent patterns 128. Details of the translucent patterns 128 have been described in the embodiment of FIG. 10A to FIG. 11D and thus are not repeated hereinafter.

The third spacers 290 are disposed on the substrate 110, and vertical projections of the third spacers 290 on the patterned light-shielding layer 120 respectively overlap the translucent patterns 128. More specifically, the third spacers 290 are disposed on the transparent layer 140 corresponding to the translucent patterns 128, so as to cover the translucent patterns 128. In this embodiment, when the device substrate 200C is a color filter substrate of a touch display panel, the third spacers 290 are main spacers or secondary spacers, for example. Moreover, in this embodiment, the material of the first spacers 270, the second spacers 280, and the third spacers 290 is a positive photoresist. The height H2 of the second spacer 280 is larger than the height H1 of the first spacer 270, and the height H3 of the third spacer 290 is between the height H1 of the first spacer 270 and the height H2 of the second spacer 280. The material of the third spacer 290 is a photosensitive material, for example. Moreover, the invention is not intended to limit the color, size, number, shape, and cross-sectional shape of the third spacers 290.

It is noted that each of the third spacers 290 has a top portion 292, a connection portion 294, and a bottom portion 296. The bottom portion 296 is a portion close to the translucent pattern 128, the top portion 292 is a portion away from the translucent pattern 128, and the connection portion 294 is located between the top portion 292 and the bottom portion 296. In this embodiment, a relationship between decomposition strengths of the photosensitive material of the third spacer 290 is: the bottom portion 296>the connection portion 294>the top portion 292 (equivalent to the relationship between the cross-linking densities, which is the top portion 292>the connection portion 294>the bottom portion 296).

FIG. 13A to FIG. 13D are schematic cross-sectional views showing a fabricating method of the device substrate of FIG. 12B. The embodiment of FIG. 13A to FIG. 13D is similar to the embodiment of FIG. 4A to FIG. 4D. Therefore, identical or similar elements are denoted by the same or similar reference numerals, which will not be described again hereinafter.

Figure 13A:
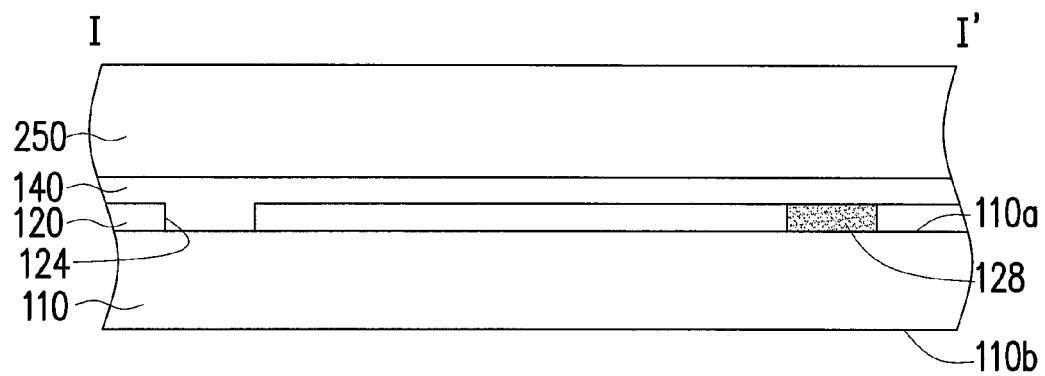
FIG. 13A to FIG. 13D are schematic cross-sectional views showing a fabricating method of the device substrate of FIG. 12B.

With reference to FIG. 13A, the structures and fabricating methods of FIG. 13A and FIG. 4A are the same or similar. Therefore, identical or similar elements are denoted by the same or similar reference numerals, which will not be described again hereinafter. In this embodiment, the material of the photoresist material layer 250 includes a photosensitive material, and the photoresist material layer 250 is a positive photoresist. Moreover, the patterned light-shielding layer 120 further has a plurality of the translucent patterns 128. Details of the translucent patterns 128 have been described in the embodiment of FIG. 10A to FIG. 11D and thus are not repeated hereinafter.

Figure 13B:
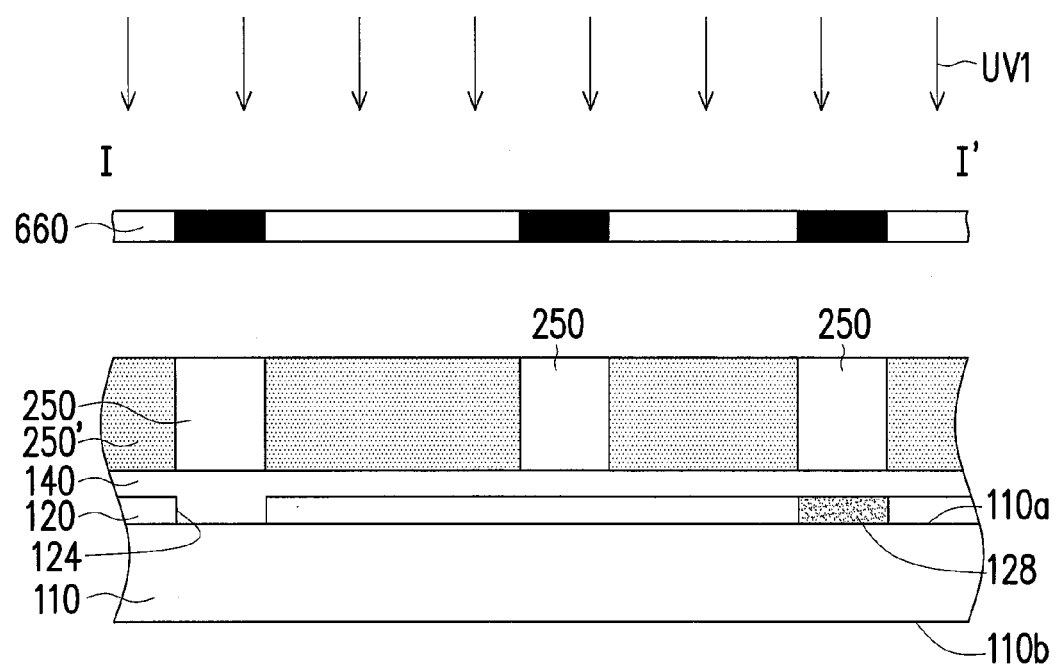
Figure 13C:
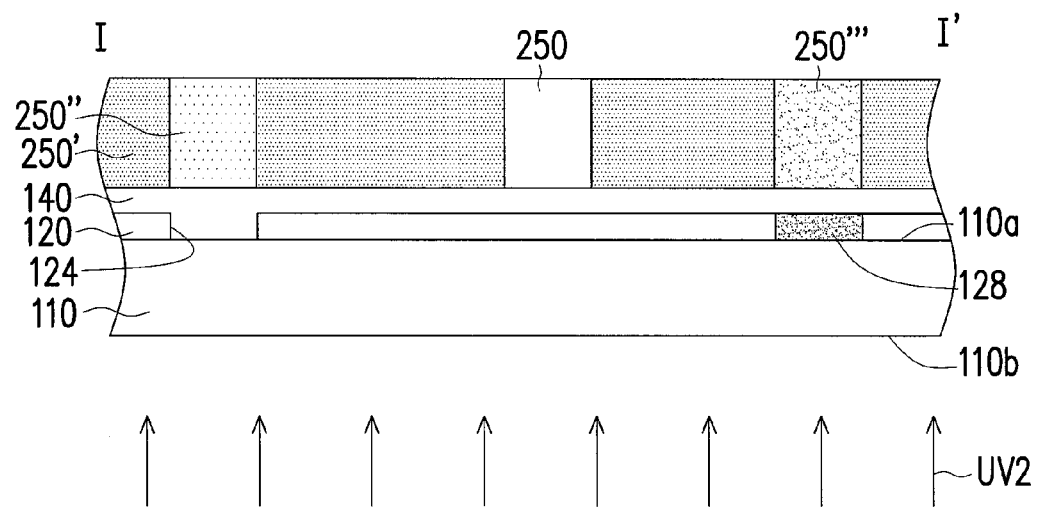
Figure 13D:
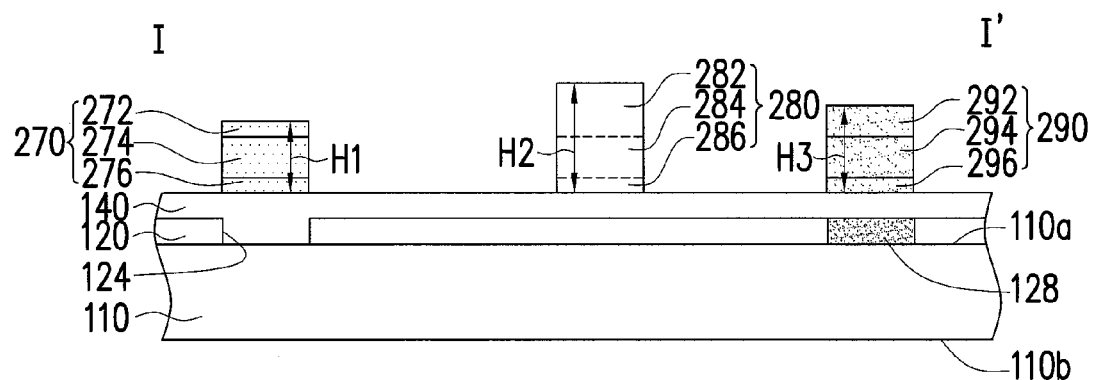

Next, as shown in FIG. 13B to FIG. 13D, an exposure process and a development process are performed on the photoresist material layer 250 to form the first spacers 270, the second spacers 280, and the third spacers 290 on the substrate 110. In the following paragraphs, Steps (a), (b), and (c) included in the exposure process and the development process performed on the photoresist material layer 250 are explained in detail.

With reference to FIG. 13B, Step (a) is to provide a mask 660 on the photoresist material layer 250, so as to perform the exposure UV1 on the photoresist material layer 250 with the mask 660 as a shielding mask. Step (a) may also be called a front exposure. In this embodiment, Step (a) is a saturated exposure, and because the photoresist material layer 250 is a positive photoresist, the decomposition strength of the photosensitive material of a portion of the photoresist material layer 250 that receives the exposure UV1 is increased (i.e. functional groups reactive to the developer increase) to form the photoresist material layer 250' that is development-intolerant (i.e. will be removed in the development step). Further, a portion of the vertical projection of the photoresist material layer 250 that does not receive the exposure UV1 respectively overlaps the first exposure opening 124, and a portion of the vertical projection respectively overlaps the translucent pattern 128. Other portions of the vertical projection are located outside the first exposure opening 124 and the translucent pattern 128 respectively.

With reference to FIG. 13C, Step (b) is to perform the exposure UV2 on the photoresist material layer 250 with the patterned light-shielding layer 120 as a shielding mask. Step (b) may also be called a back exposure. In this embodiment, Step (b) is an unsaturated exposure, and because the photoresist material layer 250 is a positive photoresist, the decomposition strength of the photosensitive material of a portion of the photoresist material layer 250 that receives the exposure UV2 through the first exposure openings 124 is slightly increased (i.e. functional groups reactive to the developer slightly increase) to form the photoresist material layer 250" that has weak development resistance (i.e. will be partially removed in the development step). Further, the decomposition strength of the photosensitive material of a portion of the photoresist material layer 250 that receives the exposure UV2 through the translucent patterns 128 is slightly increased as well, so as to form a photoresist material layer 250''' that has weak development resistance. Because the transmittance of the translucent patterns 128 is lower than the transmittance of the first exposure openings 124, the decomposition strength of the photosensitive material of the photoresist material layer 250''' is smaller than the decomposition strength of the photosensitive material of the photoresist material layer 250".

With reference to FIG. 13D, Step (c) is to develop the photoresist material layer 250 after the exposure UV2. Step (c) may also be called a development. In this embodiment, the development-intolerant photoresist material layer 250' is removed completely, the photoresist material layer 250" and the photoresist material layer 250''' that have weak development resistance are partially removed, and the photoresist material layer 250 that does not receive the exposures UV1 and UV2 is not removed. Because the decomposition strength of the photosensitive material of the photoresist material layer 250''' is smaller than the decomposition strength of the photosensitive material of the photoresist material layer 250", the portion removed from the photoresist material layer 250''' is smaller than the portion removed from photoresist material layer 250". Therefore, in Step (c), the photoresist material layer 250" that is not removed forms the first spacers 270, the photoresist material layer 250 that is not removed forms the second spacers 280, and the photoresist material layer 250''' that is not removed forms the third spacers 290. Accordingly, a plurality of the first spacers 270 and a plurality of the third spacers 290 are formed by Step (a), Step (b), and Step (c). The vertical projections of the first spacers 270 respectively overlap the first exposure openings 124, and the vertical projections of the third spacers 290 on the patterned light-shielding layer 120 respectively overlap the translucent patterns 128. A plurality of the second spacers 280 are formed by Step (a) and Step (c), and the vertical projections of the second spacers 280 are respectively outside the first exposure openings 124. Furthermore, each of the first spacers 270 has the top portion 272, the connection portion 274, and the bottom portion 276. Each of the second spacers 280 has the top portion 282, the connection portion 284, and the bottom portion 286, and each of the third spacers 290 has the top portion 292, the connection portion 294, and the bottom portion 296.

In this embodiment, because the first spacers 270 only receive the unsaturated back exposure, the relationship between the decomposition strengths of the photosensitive material of the first spacers 270 is: the bottom portion 276>the connection portion 274>the top portion 272. Furthermore, because the second spacers 280 do not receive the front exposure or the back exposure, the relationship between the decomposition strengths of the photosensitive material of the second spacers 280 is: the bottom portion 286=the connection portion 284=the top portion 282. In addition, because the third spacers 290 only receive the unsaturated back exposure, the relationship between the decomposition strengths of the photosensitive material of the third spacers 290 is: the bottom portion 296>the connection portion 294>the top portion 292. Besides, because the first spacers 270 and the third spacers 290 are respectively formed by the exposure UV2 through the first exposure openings 124 and the translucent patterns 128, and the transmittance of the translucent patterns 128 is lower than the transmittance of the first exposure openings 124, the height H3 of the third spacer 290 is larger than the height H1 of the first spacer 270. Accordingly, after hard baking, the height H2 of the second spacer 280 is larger than the height H1 of the first spacer 270, and the height H3 of the third spacer 290 is between the height H1 of the first spacer 270 and the height H2 of the second spacer 280.

In the embodiment of FIG. 13A to FIG. 13D, a sequence of the steps included in the exposure process and the development process performed on the photoresist material layer 250 is Steps (a)/(b)/(c) (i.e. Step (a) precedes Step (b), and Step (c) is after Step (a) and Step (b)), for example. However, the invention is not limited thereto. In other embodiments, the sequence of the steps included in the exposure process and the development process performed on the photoresist material layer 250 may also be Steps (b)/(a)/(c) (i.e. Step (b) precedes Step (a), and Step (c) is after Step (a) and Step (b)). Various sequences of Steps (a), (b), and (c) may be inferred by those skilled in the art from the teaching of the embodiment of FIG. 13A to FIG. 13D. Thus, details are not illustrated here.

Figure 14A:
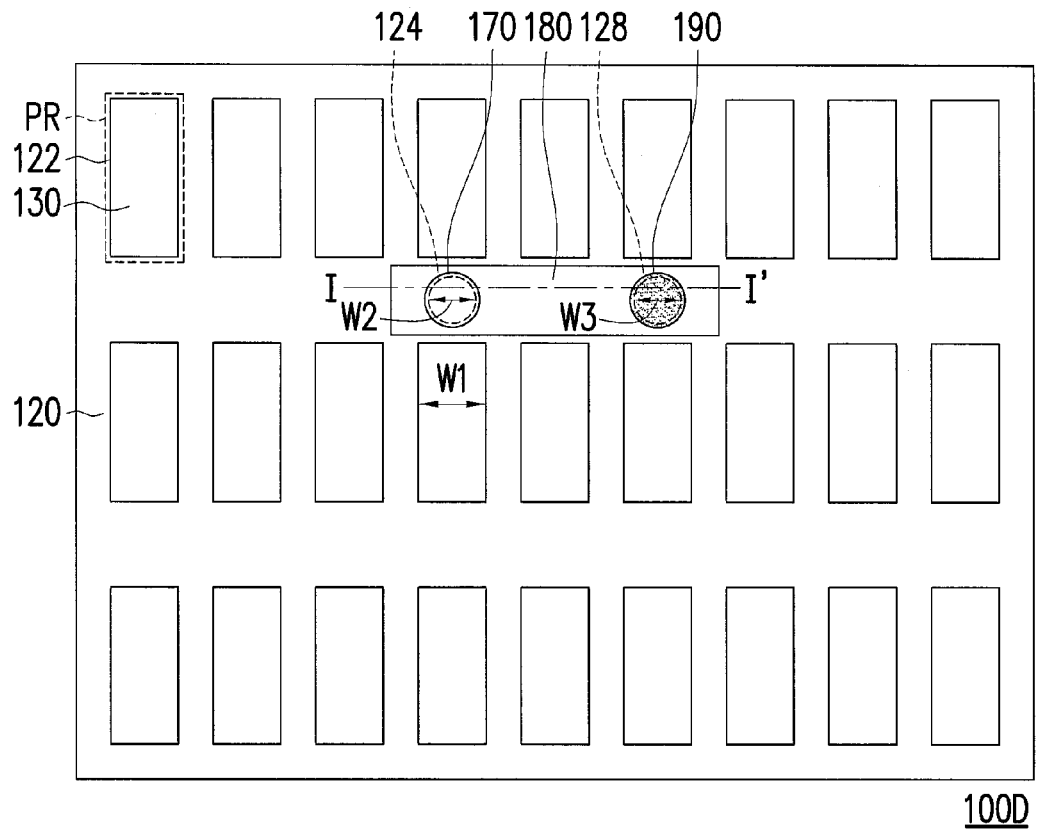
FIG. 14A is a schematic top view of a device substrate according to the seventh embodiment of the invention.
Figure 14B:
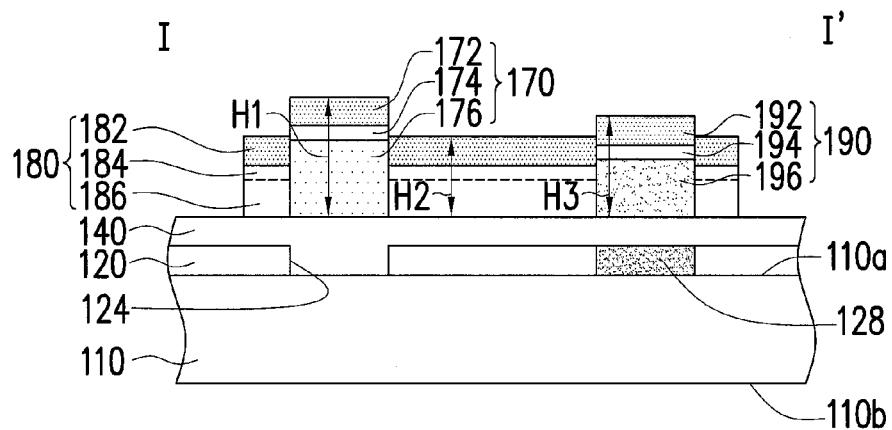
FIG. 14B is a schematic cross-sectional view of the device substrate of FIG. 14A along the line I-I'.

FIG. 14A is a schematic top view of a device substrate according to the seventh embodiment of the invention. FIG. 14B is a schematic cross-sectional view of the device substrate of FIG. 14A along the line I-I'. The embodiment of FIG. 14A to FIG. 14B is similar to the embodiment of FIG. 10A to FIG. 10B. Therefore, identical or similar elements are denoted by the same or similar reference numerals, which will not be described again hereinafter. With reference to FIG. 14A and FIG. 14B, a difference between the embodiment of FIG. 14A to FIG. 14B and the embodiment of FIG. 10A to FIG. 10B is that: in a device substrate 100D, the second spacer 180 is connected with the first spacer 170 and the third spacer 190.

Details of the first spacer 170, the second spacer 180, and the third spacer 190 have been specified in the above embodiments, and the same elements are denoted by the same reference numerals, which will not be described again hereinafter. The following paragraphs only explain the difference. In this embodiment, the second spacer 180 is connected with the first spacer 170 and the third spacer 190. The shape of the second spacer 180 in FIG. 14A is a rectangular block having two circular openings (not shown), for example. The shapes of the first spacer 170 and the third spacer 190 are circular, for example, and the first spacer 170 and the third spacer 190 are respectively located in the circular openings. However, the invention is not particularly limited to the above, as long as the second spacer 180 is connected with the first spacer 170 and the third spacer 190. For example, as shown in FIG. 14B, the first spacer 170 and the third spacer 190 may be embedded in the second spacer 180. Moreover, the invention is not intended to limit the color, size, number, shape, and cross-sectional shape of the first spacer 170, the second spacer 180, or the third spacer 190. In other embodiments, the shape of the first spacer 170, the second spacer 180, or the third spacer 190 may be circular, elliptic, rectangular, square, triangular, rhombic, polygonal, or other suitable shapes, for example.

FIG. 15A to FIG. 15D are schematic cross-sectional views showing a fabricating method of the device substrate of FIG. 14B. The embodiment of FIG. 15A to FIG. 15D is similar to the embodiment of FIG. 11A to FIG. 11D. Therefore, identical or similar elements are denoted by the same or similar reference numerals, which will not be described again hereinafter.

Figure 15A:
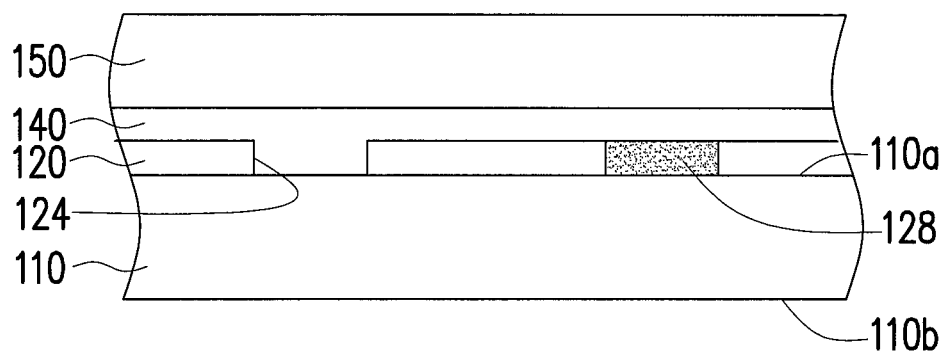
FIG. 15A to FIG. 15D are schematic cross-sectional views showing a fabricating method of the device substrate of FIG. 14B.

With reference to FIG. 15A, the structures and fabricating methods of FIG. 15A and FIG. 11A are the same. Therefore, identical elements are denoted by the same reference numerals, which will not be described again hereinafter. In this embodiment, the material of the photoresist material layer 150 includes a photosensitive material, and the photoresist material layer 150 is a negative photoresist.

Figure 15B:
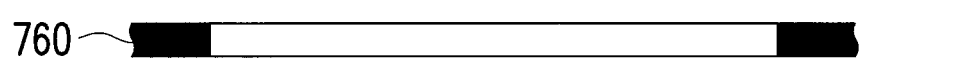
Figure 15B:
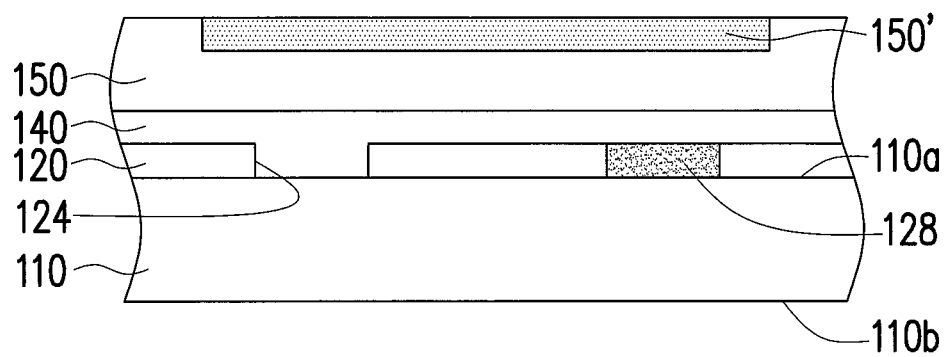
Figure 15C:
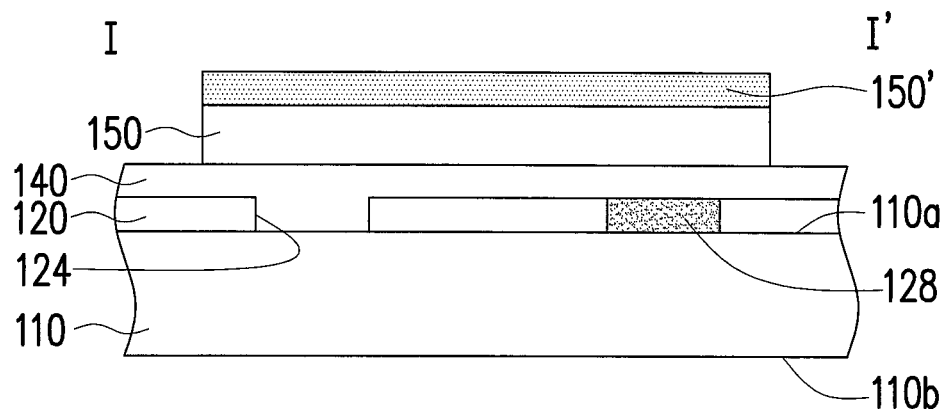
Figure 15D:
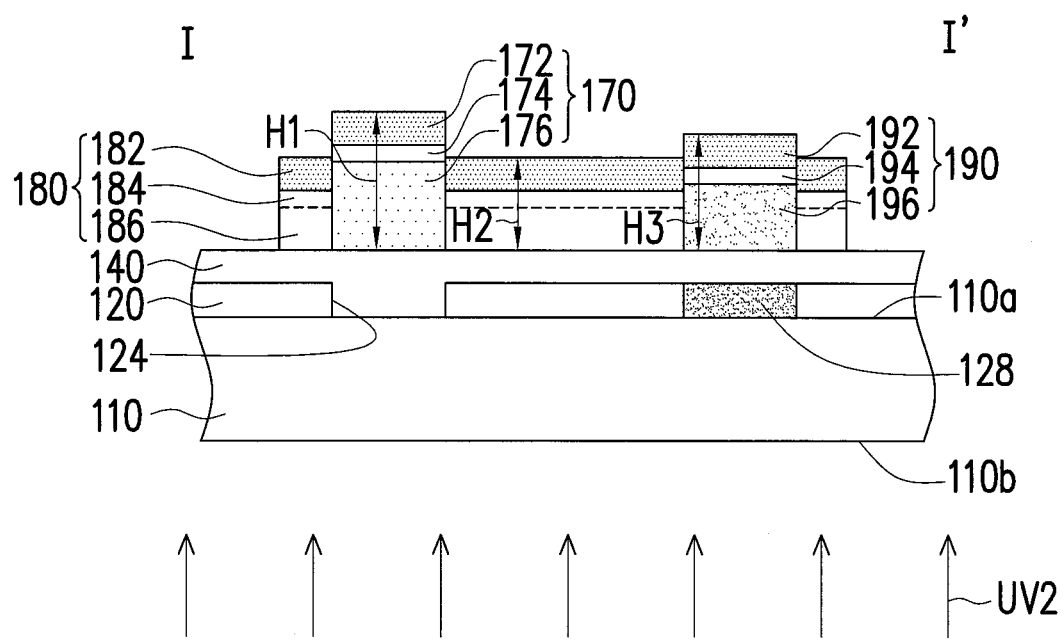

Next, as shown in FIG. 15B to FIG. 15D, an exposure process and a development process are performed on the photoresist material layer 150 to form a plurality of the first spacers 170, a plurality of the second spacers 180, and a plurality of the third spacers 190 on the substrate 110. In the following paragraphs, Steps (a), (b), and (c) included in the exposure process and the development process performed on the photoresist material layer 150 are explained in detail.

With reference to FIG. 15B, Step (a) is to provide a mask 760 on the photoresist material layer 150, so as to perform the exposure UV1 on the photoresist material layer 150 with the mask 760 as a shielding mask. Step (a) may also be called a front exposure. In this embodiment, Step (a) is an unsaturated exposure, and because the photoresist material layer 150 is a negative photoresist, the cross-linking density of the photosensitive material of a portion of the photoresist material layer 150 that receives the exposure UV1 is increased to form the photoresist material layer 150' (including the top portion 172, the top portion 182, and the top portion 192) that is high development-resistant (i.e. will not be removed in the development step). A portion (e.g. the top portion 172) of the vertical projection of the photoresist material layer 150' respectively overlaps the first exposure opening 124, and a portion (e.g. the top portion 192) of the vertical projection respectively overlaps the translucent pattern 128. Other portions (e.g. the top portion 182) of the vertical projection are located outside the first exposure opening 124 and the translucent pattern 128 respectively.

With reference to FIG. 15C, Step (b) is to develop the photoresist material layer 150 after the exposure UV1. Step (b) may also be called a development. In this embodiment, because the development-resistant photoresist material layer 150' covers a portion of the photoresist material layer 150, the portion of the photoresist material layer 150 covered by the photoresist material layer 150' is not removed in Step (b) while the uncovered portion of the photoresist material layer 150 is removed.

With reference to FIG. 15D, Step (c) is to perform the exposure UV2 on the photoresist material layer 150 with the patterned light-shielding layer 120 as a shielding mask. Step (c) may also be called a back exposure. In this embodiment, Step (c) is a saturated exposure, and because the photoresist material layer 150 is a negative photoresist, the cross-linking density of the photosensitive material of a portion of the photoresist material layer 150 that receives the exposure UV2 is increased to form the bottom portion 176 and the bottom portion 196 through the first exposure openings 124 and the translucent patterns 128 respectively. In Step (c), a portion of the photoresist material layer 150 that does not receive the exposure UV2 forms the connection portion 174, the connection portion 194, the connection portion 184, and the bottom portion 186. Accordingly, a plurality of the first spacers 170 and a plurality of the third spacers 190 are formed by Step (a), Step (b), and Step (c). The vertical projections of the first spacers 170 respectively overlap the first exposure openings 124, and the vertical projections of the third spacers 190 on the patterned light-shielding layer 120 respectively overlap the translucent patterns 128. Accordingly, a plurality of the second spacers 180 are formed by Step (a) and Step (b), and the vertical projections of the second spacers 180 are respectively outside the first exposure openings 124 and the translucent patterns 128. Furthermore, each of the first spacers 170 has the top portion 172, the connection portion 174, and the bottom portion 176. Each of the second spacers 180 has the top portion 182, the connection portion 184, and the bottom portion 186, and each of the third spacers 190 has the top portion 192, the connection portion 194, and the bottom portion 196. Moreover, after hard baking, the height H1 of the first spacer 170 is larger than the height H2 of the second spacer 180, and the height H3 of the third spacer 190 is between the height H1 of the first spacer 170 and the height H2 of the second spacer 180.

In the embodiment of FIG. 15A to FIG. 15D, a sequence of the steps included in the exposure process and the development process performed on the photoresist material layer 150 is Steps (a)/(b)/(c), for example. However, the invention is not limited thereto. In other embodiments, the sequence of the steps included in the exposure process and the development process performed on the photoresist material layer 150 may also be Steps (c)/(b)/(a), Steps (a)/(c)/(b), or Steps (c)/(a)/(b), as long as Step (a) precedes Step (c) or Step (c) precedes Step (a). Various sequences of Steps (a), (b), and (c) may be inferred by those skilled in the art from the teaching of the embodiment of FIG. 15A to FIG. 15D. Thus, details are not illustrated here.

Figure 16A:
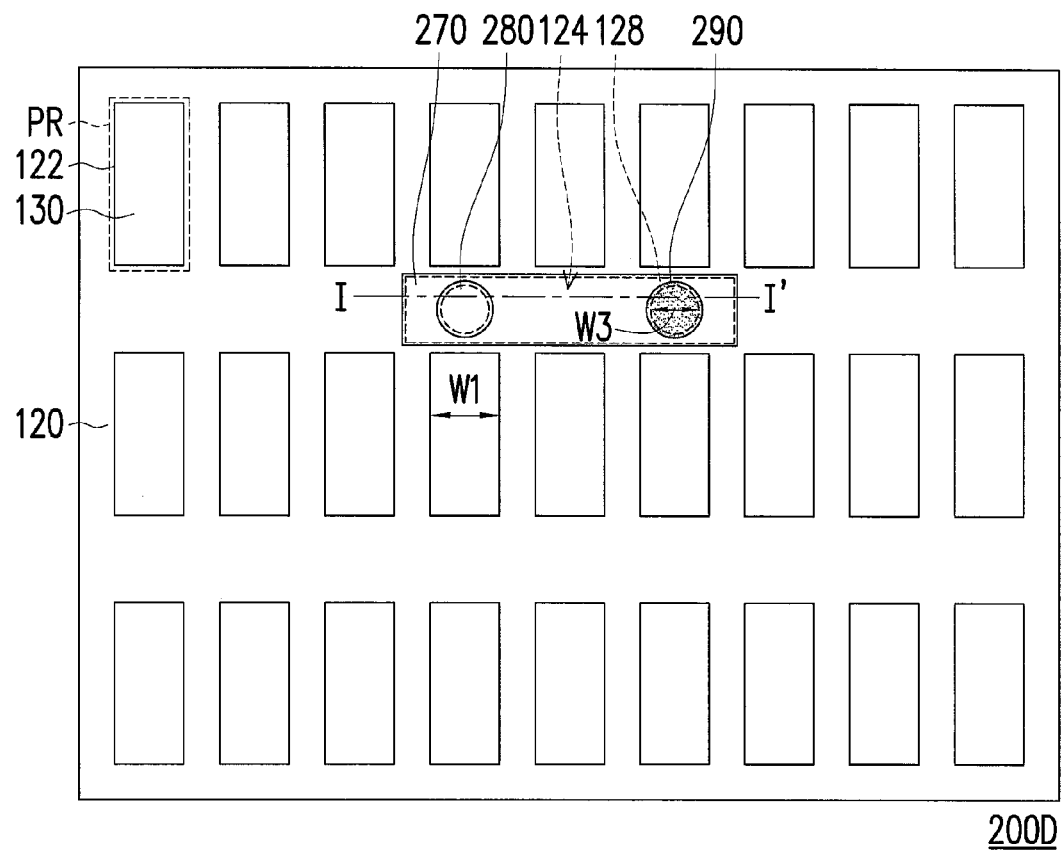
FIG. 16A is a schematic top view of a device substrate according to the eighth embodiment of the invention.
Figure 16B:
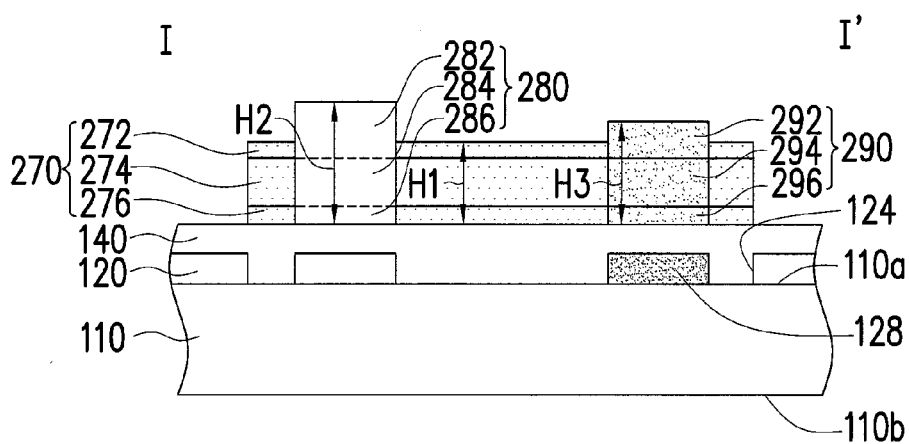
FIG. 16B is a schematic cross-sectional view of the device substrate of FIG. 16A along the line I-I'.

FIG. 16A is a schematic top view of a device substrate according to the eighth embodiment of the invention. FIG. 16B is a schematic cross-sectional view of the device substrate of FIG. 16A along the line I-I'. The embodiment of FIG. 16A to FIG. 16B is similar to the embodiment of FIG. 12A to FIG. 12B. Therefore, identical or similar elements are denoted by the same or similar reference numerals, which will not be described again hereinafter. With reference to FIG. 16A and FIG. 16B, a difference between the embodiment of FIG. 16A to FIG. 16B and the embodiment of FIG. 12A to FIG. 12B is that: in a device substrate 200D, the first spacer 270 is connected with the second spacer 280 and the third spacer 290.

Details of the first spacer 270, the second spacer 280, and the third spacer 290 have been specified in the above embodiments, and the same elements are denoted by the same reference numerals, which will not be described again hereinafter. The following paragraphs only explain the difference. In this embodiment, the first spacer 270 is connected with the second spacer 280 and the third spacer 290. The shape of the first spacer 270 in FIG. 16A is a rectangular block having two circular openings (not shown), for example. The shapes of the second spacer 280 and the third spacer 290 are circular, for example, and the second spacer 280 and the third spacer 290 are respectively located in the circular openings of the first spacer 270. However, the invention is not particularly limited to the above, as long as the first spacer 270 is connected with the second spacer 280 and the third spacer 290. For example, as shown in FIG. 16B, the second spacer 280 and the third spacer 290 may be embedded in the first spacer 270. Moreover, the invention is not intended to limit the color, size, number, shape, and cross-sectional shape of the first spacer 270, the second spacer 280, or the third spacer 290. In other embodiments, the shape or the outline of the first spacer 270, the second spacer 280, or the third spacer 290 may be circular, elliptic, rectangular, square, triangular, rhombic, polygonal, or other suitable shapes, for example.

FIG. 17A to FIG. 17D are schematic cross-sectional views showing a fabricating method of the device substrate of FIG. 16B. The embodiment of FIG. 17A to FIG. 17D is similar to the embodiment of FIG. 13A to FIG. 13D. Therefore, identical or similar elements are denoted by the same or similar reference numerals, which will not be described again hereinafter.

Figure 17A:
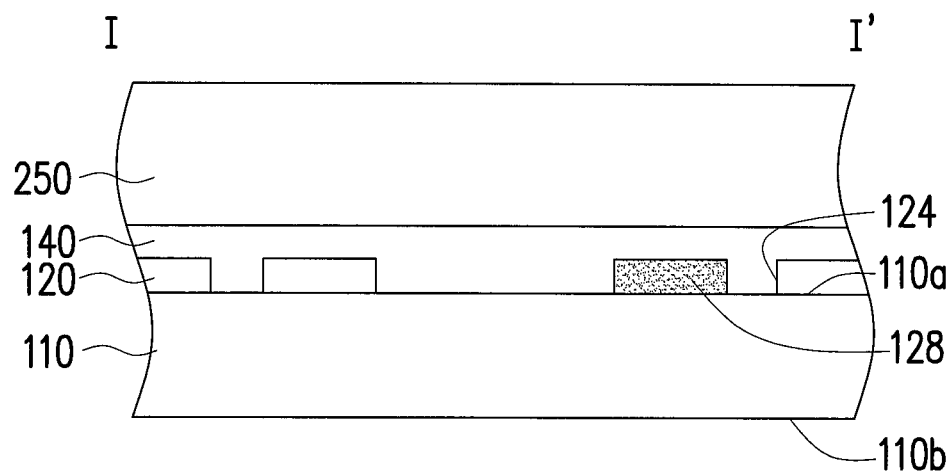
FIG. 17A to FIG. 17D are schematic cross-sectional views showing a fabricating method of the device substrate of FIG. 16B.

With reference to FIG. 17A, the structures and fabricating methods of FIG. 17A and FIG. 13A are the same or similar Therefore, identical or similar elements are denoted by the same or similar reference numerals, which will not be described again hereinafter. In this embodiment, the material of the photoresist material layer 250 includes a photosensitive material, and the photoresist material layer 250 is a positive photoresist. Moreover, the translucent pattern 128 and a portion of the patterned light-shielding layer 120 are located in the first exposure opening 124.

Figure 17B:
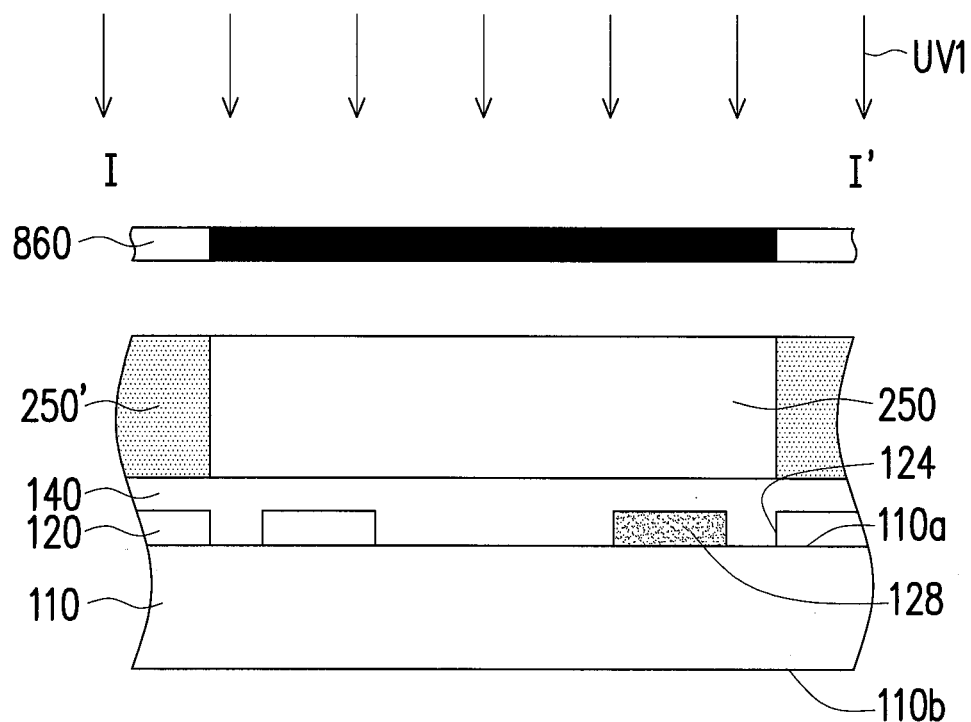
Figure 17C:
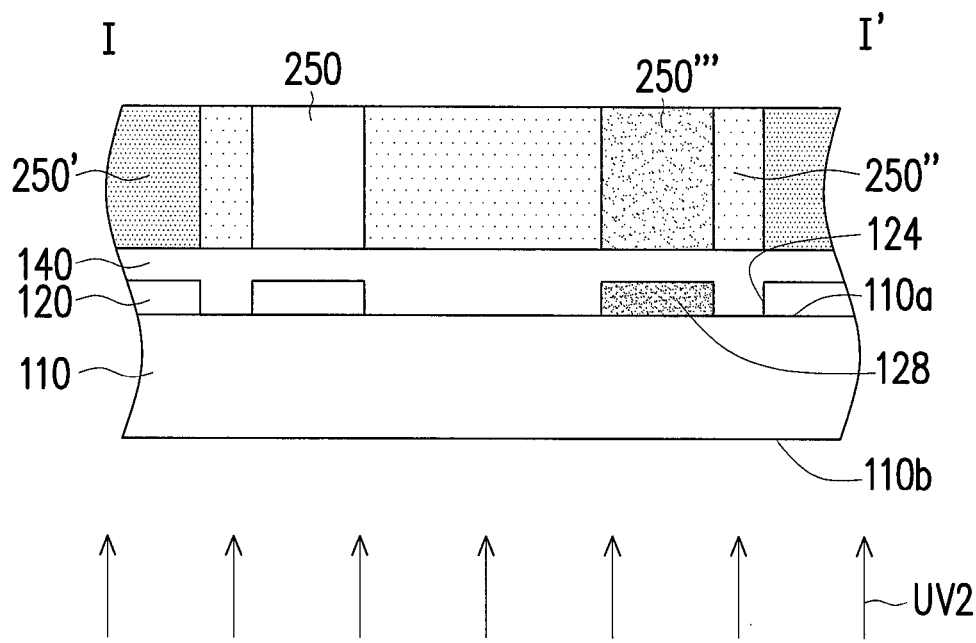
Figure 17D:
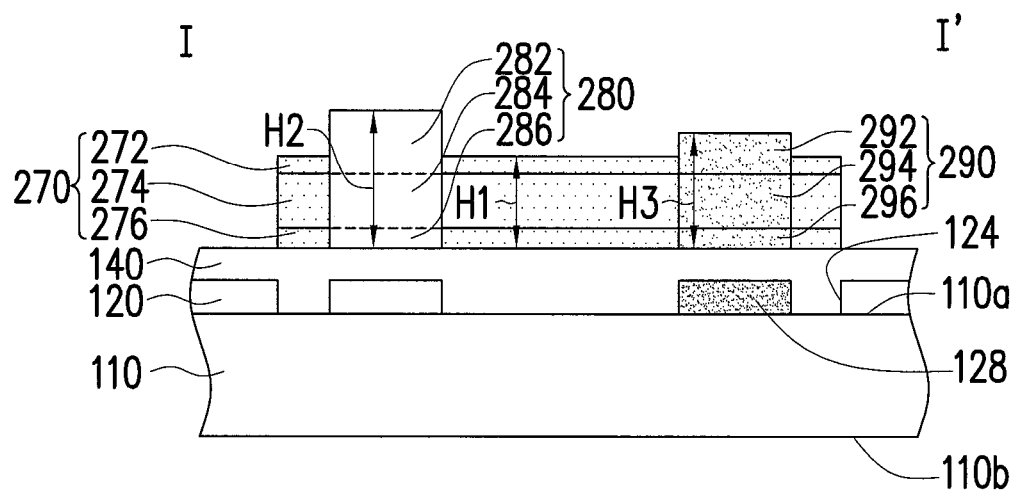

Next, as shown in FIG. 17B to FIG. 17D, an exposure process and a development process are performed on the photoresist material layer 250 to form the first spacers 270, the second spacers 280, and the third spacers 290 on the substrate 110. In the following paragraphs, Steps (a), (b), and (c) included in the exposure process and the development process performed on the photoresist material layer 250 are explained in detail.

With reference to FIG. 17B, Step (a) is to provide a mask 860 on the photoresist material layer 250, so as to perform the exposure UV1 on the photoresist material layer 250 with the mask 860 as a shielding mask. Step (a) may also be called a front exposure. In this embodiment, Step (a) is a saturated exposure, and because the photoresist material layer 250 is a positive photoresist, the decomposition strength of the photosensitive material of a portion of the photoresist material layer 250 that receives the exposure UV1 is increased (i.e. functional groups reactive to the developer increase) to form the photoresist material layer 250' that is development-intolerant (i.e. will be removed in the development step). Further, a portion of the vertical projection of the photoresist material layer 250 that does not receive the exposure UV1 respectively overlaps the first exposure opening 124, and a portion of the vertical projection respectively overlaps the translucent pattern 128. Other portions of the vertical projection are located outside the first exposure opening 124 and the translucent pattern 128 respectively.

With reference to FIG. 17C, Step (b) is to perform the exposure UV2 on the photoresist material layer 250 with the patterned light-shielding layer 120 as a shielding mask. Step (b) may also be called a back exposure. In this embodiment, Step (b) is an unsaturated exposure, and because the photoresist material layer 250 is a positive photoresist, the decomposition strength of the photosensitive material of a portion of the photoresist material layer 250 that receives the exposure UV2 through the first exposure openings 124 is slightly increased (i.e. functional groups reactive to the developer slightly increase) to form the photoresist material layer 250" that has weak development resistance (i.e. will be partially removed in the development step). Further, the decomposition strength of the photosensitive material of a portion of the photoresist material layer 250 that receives the exposure UV2 through the translucent patterns 128 is slightly increased as well, so as to form the photoresist material layer 250' that has weak development resistance. Because the transmittance of the translucent patterns 128 is lower than the transmittance of the first exposure openings 124, the decomposition strength of the photosensitive material of the photoresist material layer 250''' is smaller than the decomposition strength of the photosensitive material of the photoresist material layer 250".

With reference to FIG. 17D, Step (c) is to develop the photoresist material layer 250 after the exposure UV2. Step (c) may also be called a development. In this embodiment, the development-intolerant photoresist material layer 250' is removed completely, the photoresist material layer 250" and the photoresist material layer 250''' that have weak development resistance are partially removed, and the photoresist material layer 250 that does not receive the exposures UV1 and UV2 is not removed. Because the decomposition strength of the photosensitive material of the photoresist material layer 250''' is smaller than the decomposition strength of the photosensitive material of the photoresist material layer 250'', the portion removed from the photoresist material layer 250''' is smaller than the portion removed from photoresist material layer 250". Therefore, in Step (c), the photoresist material layer 250" that is not removed forms the first spacers 270, the photoresist material layer 250 that is not removed forms the second spacers 280, and the photoresist material layer 250''' that is not removed forms the third spacers 290. Accordingly, a plurality of the first spacers 270 and a plurality of the third spacers 290 are formed by Step (a), Step (b), and Step (c). The vertical projections of the first spacers 270 respectively overlap the first exposure openings 124, and the vertical projections of the third spacers 290 on the patterned light-shielding layer 120 respectively overlap the translucent patterns 128. Accordingly, a plurality of the second spacers 280 are formed by Step (a) and Step (c), and the vertical projections of the second spacers 280 are respectively outside the first exposure openings 124 and the translucent patterns 128. Furthermore, each of the first spacers 270 includes the top portion 272, the connection portion 274, and the bottom portion 276. Each of the second spacers 280 includes the top portion 282, the connection portion 284, and the bottom portion 286, and each of the third spacers 290 includes the top portion 292, the connection portion 294, and the bottom portion 296. Moreover, after hard baking, the height H2 of the second spacer 280 is larger than the height H1 of the first spacer 270, and the height H3 of the third spacer 290 is between the height H1 of the first spacer 270 and the height H2 of the second spacer 280.

In the embodiment of FIG. 17A to FIG. 17D, a sequence of the steps included in the exposure process and the development process performed on the photoresist material layer 250 is Steps (a)/(b)/(c) (i.e. Step (a) precedes Step (b), and Step (c) is after Step (a) and Step (b)), for example. However, the invention is not limited thereto. In other embodiments, the sequence of the steps included in the exposure process and the development process performed on the photoresist material layer 250 may also be Steps (b)/(a)/(c) (i.e. Step (b) precedes Step (a), and Step (c) is after Step (a) and Step (b)). Various sequences of Steps (a), (b), and (c) may be inferred by those skilled in the art from the teaching of the embodiment of FIG. 17A to FIG. 17D. Thus, details are not illustrated here.

In any of the above embodiments, the device substrate includes the first and second spacers, or the first, second, and third spacers, for example. However, the invention is not limited thereto. In other embodiments, the device substrate may include the second and third spacers, or the first and third spacers, for example. Moreover, the invention is not intended to limit the number of these spacers. Additionally, in any of the above embodiments, the spacer overlaps one first exposure opening, one second exposure opening, or one translucent pattern, for example. However, the invention is not limited thereto. In other embodiments, the spacer may overlap at least one first exposure opening, at least one second exposure opening, or at least one translucent pattern. In other words, the invention is not intended to limit the number of the exposure openings or translucent patterns that each spacer overlaps. Moreover, the multiple translucent patterns 128 may include at least one color to form the third spacers having different heights. For example, if the spacer is a negative photoresist, blue translucent patterns may be used to fabricate higher third spacers and green translucent patterns may be used to form lower third spacers.

In any of the above embodiments, if the spacer (e.g. the first spacer 170, the second spacer 180, the third spacer 190, the first spacer 270, the second spacer 280, or the third spacer 290) is a negative photoresist or a positive photoresist, the cross-linking densities of the photosensitive material of the spacer differ between the top portion, the connection portion, and the bottom portion. However, it is noted that the invention is not limited thereto. The scope of the invention covers various embodiments as long as the cross-linking density of the photosensitive material of the connection portion is smaller than the cross-linking density of the photosensitive material of at least one of the top portion and the bottom portion. In addition, in any of the above embodiments, a general mask (e.g. the mask 160, 260, 360, 460, 560, 660, 760, or 860) is used as the shielding mask for performing the front exposure on the photoresist material layer, for example. However, the invention is not limited thereto. In other embodiments, a phase shift mask, half tone mask, or gray tone mask may be used as the shielding mask for performing the front exposure on the photoresist material layer.

In conclusion, according to the device substrate and the fabricating method of the invention, the patterned light-shielding layer has the exposure openings (or translucent patterns), and the exposure openings and the pixel openings have different areas and/or shapes. Therefore, in addition to using a general mask as the shielding mask for performing the front exposure on the photoresist material layer, the patterned light-shielding layer can serve as the shielding mask for performing the back exposure on the photoresist material layer, wherein the photoresist material layer may be a negative or positive photoresist. Accordingly, by combining the steps of front exposure, back exposure, non-exposure, and development and controlling different exposure doses (saturated or unsaturated exposure), main spacers and secondary spacers having different heights can be fabricated and favorable level difference (i.e. height difference) control capability can be achieved. Thus, the device substrate and the fabricating method of the invention have advantages of lower production costs and simpler fabricating processes. Furthermore, the device substrate and the fabricating method of the invention are applicable to the fabrication of spacers with different structures (e.g. spacers having a rectangular or stepped cross-sectional shape).

It will be apparent to those skilled in the art that various modifications and variations can be made to the disclosed embodiments without departing from the scope or spirit of the invention. In view of the foregoing, it is intended that the disclosure covers modifications and variations provided that they fall within the scope of the following claims and their equivalents.

What is claimed is:

1. A device substrate, comprising:
   a substrate;
   a patterned light-shielding layer disposed on the substrate and having a plurality of pixel openings and a plurality of first exposure openings, wherein one of the first exposure openings and one of the pixel openings have different areas and/or shapes;
   a plurality of first spacers disposed on the substrate, and vertical projections of the first spacers respectively overlap the first exposure openings, wherein a height of each of the first spacers is in a range of 1 micrometer to 6 micrometers; and
   a plurality of second spacers disposed on the substrate, and vertical projections of the second spacers are located outside the first exposure openings respectively, wherein (a) when a material of the first spacers and the second spacers is a negative photoresist, the height of each of the first spacers is larger than a height of each of the second spacers; and (b) when the material of the first spacers and the second spacers is a positive photoresist, the height of each of the second spacers is larger than the height of each of the first spacers.

2. The device substrate according to claim 1, wherein any one of the first exposure openings is located between two adjacent pixel openings, and a width of the first exposure opening is in a range of 4 micrometers to 40 micrometers and a width of the pixel opening is in a range of 12 micrometers to 120 micrometers.

3. The device substrate according to claim 1, further comprising a plurality of color filter patterns respectively disposed in the pixel openings and outside the first exposure openings.

4. The device substrate according to claim 1, wherein (a) when the material of the first spacers and the second spacers is the negative photoresist, the height of each of the first spacers is larger than the height of each of the second spacers, wherein each of the first spacers has a first portion and a second portion connected with a periphery of the first portion, a vertical projection of the first portion on the patterned light-shielding layer overlaps the corresponding first exposure opening, a vertical projection of the second portion on the patterned light-shielding layer is located outside the corresponding first exposure opening, and a height of the first portion is larger than a height of the second portion; and (b) when the material of the first spacers and the second spacers is the positive photoresist, the height of each of the second spacers is larger than the height of each of the first spacers, and the patterned light-shielding layer further has a plurality of second exposure openings, wherein each of the second spacers has a first portion and a second portion connected with a periphery of the first portion, a vertical projection of the second portion on the patterned light-shielding layer overlaps the corresponding second exposure opening, and a height of the first portion is larger than a height of the second portion.

5. The device substrate according to claim 1, wherein the patterned light-shielding layer further has a plurality of translucent patterns, and the device substrate further comprises a plurality of third spacers disposed on the substrate, wherein vertical projections of the third spacers on the patterned light-shielding layer respectively overlap the translucent patterns, and a height of each of the third spacers is between the height of each of the first spacers and the height of each of the second spacers, wherein (a) when the material of the first spacers, the second spacers, and the third spacer is the negative photoresist, the height of each of the second spacers is smaller than the height of each of the first spacers; and (b) when the material of the first spacers, the second spacers, and the third spacers is the positive photoresist, the height of each of the first spacers is smaller than the height of each of the second spacers.

6. The device substrate according to claim 1, wherein the patterned light-shielding layer further has a plurality of translucent patterns and a transmittance of the translucent patterns is lower than a transmittance of the first exposure openings, and the device substrate further comprises a plurality of third spacers disposed on the substrate, wherein vertical projections of the third spacers on the patterned light-shielding layer respectively overlap the translucent patterns, a height of each of the third spacers is between the height of each of the first spacers and the height of each of the second spacers, and the second spacers are connected with the first spacers and the third spacers, wherein the material of the first spacers, the second spacers, and the third spacers is the negative photoresist, and the height of each of the second spacers is smaller than the height of each of the first spacers.

7. The device substrate according to claim 1, wherein the material of the first spacers comprises a photosensitive material, and each of the first spacers has a top portion, a connection portion, and a bottom portion, wherein the connection portion is located between the top portion and the bottom portion, wherein a cross-linking density of the photosensitive material of the connection portion is smaller than or equal to a cross-linking density of the photosensitive material of at least one of the top portion and the bottom portion, or a decomposition strength of the photosensitive material of the connection portion is larger than or equal to a decomposition strength of the photosensitive material of at least one of the top portion and the bottom portion.

8. The device substrate according to claim 1, wherein the patterned light-shielding layer further has a plurality of translucent patterns and a transmittance of the translucent patterns is lower than a transmittance of the first exposure openings, and the device substrate further comprises a plurality of third spacers disposed on the substrate, wherein vertical projections of the second spacers are located inside the first exposure openings respectively, vertical projections of the third spacers on the patterned light-shielding layer respectively overlap the translucent patterns, a height of each of the third spacers is between the height of each of the first spacers and the height of each of the second spacers, and the first spacers are connected with the second spacers and the third spacers, wherein the material of the first spacers, the second spacers, and the third spacers is the positive photoresist, and the height of each of the first spacers is smaller than the height of each of the second spacers.

9. A device substrate comprising:
   a substrate; and
   a plurality of spacers disposed on the substrate, wherein a material of the spacers comprises a photosensitive material, and each of the spacers has a top portion, a connection portion, and a bottom portion, wherein the connection portion is located between the top portion and the bottom portion, a material of the top portion, a material of the connection portion, and a material of the bottom portion are the same, wherein a cross-linking density of the photosensitive material of the connection portion is smaller than or equal to a cross-linking density of the photosensitive material of at least one of the top portion and the bottom portion, or a decomposition strength of the photosensitive material of the connection portion is larger than or equal to a decomposition strength of the photosensitive material of at least one of the top portion and the bottom portion.

10. The device substrate according to claim 9, wherein the photosensitive material comprises:
   at least one compound having a main structure selected from polymethyl methacrylate (PMMA), polyimide (PI), or siloxane and a functional group selected from acryl, epoxy, or novolak; and
   a plurality of photo initiators having different absorption wavelengths.

* * * * *